United States Patent
Cho et al.

(10) Patent No.: US 12,471,345 B2
(45) Date of Patent: Nov. 11, 2025

(54) SEMICONDUCTOR DEVICE AND METHOD FOR MANUFACTURING THE SAME

(71) Applicant: Samsung Electronics Co., Ltd., Suwon-si (KR)

(72) Inventors: Edwardnamkyu Cho, Suwon-si (KR); Seokhoon Kim, Suwon-si (KR); Jungtaek Kim, Suwon-si (KR); Pankwi Park, Suwon-si (KR); Sumin Yu, Suwon-si (KR); Seojin Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 18/190,837

(22) Filed: Mar. 27, 2023

(65) Prior Publication Data

US 2024/0136425 A1 Apr. 25, 2024
US 2024/0234541 A9 Jul. 11, 2024

(30) Foreign Application Priority Data

Oct. 25, 2022 (KR) .................. 10-2022-0138736

(51) Int. Cl.

| | | |
|---|---|---|
| H01L 29/66 | (2006.01) | |
| H01L 29/06 | (2006.01) | |
| H01L 29/423 | (2006.01) | |
| H01L 29/775 | (2006.01) | |
| H01L 29/786 | (2006.01) | |

(Continued)

(52) U.S. Cl.
CPC ......... *H10D 64/017* (2025.01); *H10D 30/014* (2025.01); *H10D 30/43* (2025.01); *H10D 30/6735* (2025.01); *H10D 30/6757* (2025.01); *H10D 62/121* (2025.01)

(58) Field of Classification Search
CPC .. H10D 30/014; H10D 30/43; H10D 30/6735; H10D 30/6757; H10D 62/118; H10D 62/119; H10D 62/121; H10D 64/017
See application file for complete search history.

(56) References Cited

U.S. PATENT DOCUMENTS 7,402,483 B2 7/2008 Yun et al.
2017/0323941 A1* 11/2017 Obradovic ......... H10D 30/4732
(Continued)

*Primary Examiner* — David C Spalla
(74) *Attorney, Agent, or Firm* — Fish & Richardson P.C.

(57) ABSTRACT

A manufacturing method of a semiconductor device, includes forming a plurality of main gate sacrificial patterns spaced apart from each other on a stacked structure of subgate sacrificial patterns and semiconductor patterns; forming a first insulating layer between main gate sacrificial patterns; removing the main gate sacrificial patterns; removing the subgate sacrificial patterns; forming a main gate dummy pattern in a space from which the main gate sacrificial patterns are removed; forming a plurality of subgate dummy patterns in a space from which the subgate sacrificial patterns are removed; forming a recess under a space where the first insulating layer is removed; forming a source/drain pattern within the recess; forming a second insulating layer on the source/drain pattern; removing the main gate dummy pattern and the subgate dummy patterns; and forming a gate electrode in a space where the main gate dummy pattern and the subgate dummy patterns are removed.

20 Claims, 32 Drawing Sheets

(51) Int. Cl.
  *H10D 30/01* (2025.01)
  *H10D 30/43* (2025.01)
  *H10D 30/67* (2025.01)
  *H10D 62/10* (2025.01)
  *H10D 64/01* (2025.01)

(56) References Cited

U.S. PATENT DOCUMENTS

| | | | |
|---|---|---|---|
| 2021/0280674 A1* | 9/2021 | Chang | H10D 30/024 |
| 2022/0037521 A1 | 2/2022 | You et al. | |
| 2022/0093734 A1* | 3/2022 | Chan | H10D 30/6748 |
| 2022/0115498 A1 | 4/2022 | Chu et al. | |
| 2022/0278195 A1* | 9/2022 | Ando | H10D 62/121 |
| 2023/0155035 A1* | 5/2023 | Fung | H10D 30/031 |
| | | | 257/347 |

* cited by examiner

SEMICONDUCTOR DEVICE AND METHOD FOR MANUFACTURING THE SAME

CROSS-REFERENCE TO RELATED APPLICATION

This application claims priority to and the benefit of Korean Patent Application No. 10-2022-0138736, filed in the Korean Intellectual Property Office on Oct. 25, 2022, the entire contents of which are incorporated herein by reference.

BACKGROUND

Various example embodiments relate to a semiconductor device and/or a manufacturing method thereof.

A semiconductor is or includes a material belonging to an intermediate region between a conductor and an insulator, and may refer to a material that conducts electricity under a predetermined condition. Various semiconductor devices can be manufactured by using such a semiconductor material, and for example, a memory device and/or the like can be manufactured. Such a semiconductor device may be used in various electronic devices.

In accordance with shrinking or miniaturization and/or high integration trends of electronic devices, it is necessary or desirable to finely form patterns constituting a semiconductor device. A defect such as a short circuit between wires or electrodes formed of such fine patterns may occur.

SUMMARY

Various example embodiments have been made in an effort to provide a semiconductor device and a manufacturing method thereof, capable of stably or more stably forming fine patterns.

Some example embodiments provides a manufacturing method of a semiconductor device, including: alternately stacking a plurality of subgate sacrificial patterns and a plurality of semiconductor patterns on a substrate; forming a plurality of main gate sacrificial patterns spaced apart from each other on a stacked structure of the subgate sacrificial patterns and the semiconductor patterns; forming a first insulating layer between the main gate sacrificial patterns; removing the main gate sacrificial patterns; removing the subgate sacrificial patterns; forming a main gate dummy pattern in a space from which the main gate sacrificial patterns are removed; forming a plurality of subgate dummy patterns in a space from which the subgate sacrificial patterns are removed; removing the first insulating layer and forming a recess under a space where the first insulating layer is removed; forming a source/drain pattern within the recess; forming a second insulating layer on the source/drain pattern; removing the main gate dummy pattern and the subgate dummy patterns; and forming a gate electrode in a space where the main gate dummy pattern and the subgate dummy patterns are removed. Alternatively or additionally, some example embodiments provides a manufacturing method of a semiconductor device, including: alternately stacking a plurality of subgate sacrificial patterns and a plurality of semiconductor patterns on a substrate; forming a plurality of main gate sacrificial patterns spaced apart from each other on a stacked structure of the subgate sacrificial patterns and the semiconductor patterns; forming a first insulating layer between the main gate sacrificial patterns; removing the main gate sacrificial patterns; removing some regions of the subgate sacrificial patterns and leaving some other regions; forming a main gate dummy pattern in a space from which the main gate sacrificial patterns are removed, and forming a plurality of subgate dummy patterns in a space from which some regions of the subgate sacrificial patterns are removed; forming a recess by removing the first insulating layer and removing a portion of a plurality of semiconductor patterns and a plurality of subgate sacrificial patterns positioned under a space where the first insulating layer is removed; forming a source/drain pattern within the recess; forming a second insulating layer on the source/drain pattern; removing the main gate dummy pattern and the subgate dummy patterns; and forming a gate electrode in a space where the main gate dummy pattern and the subgate dummy patterns are removed.

Alternatively or additionally, some example embodiments include a semiconductor device includes a substrate, a plurality of channel patterns spaced apart from each other and stacked on the substrate, a gate electrode surrounding the channel patterns, a gate insulating layer between the channel patterns and the gate electrode, source/drain patterns at opposite sides of the channel patterns; and a plurality of subgate sacrificial patterns between the gate electrode and the source/drain patterns.

According to various example embodiments, it may be possible to more stably form fine patterns included in a semiconductor device.

DETAILED DESCRIPTION

Figure 1:
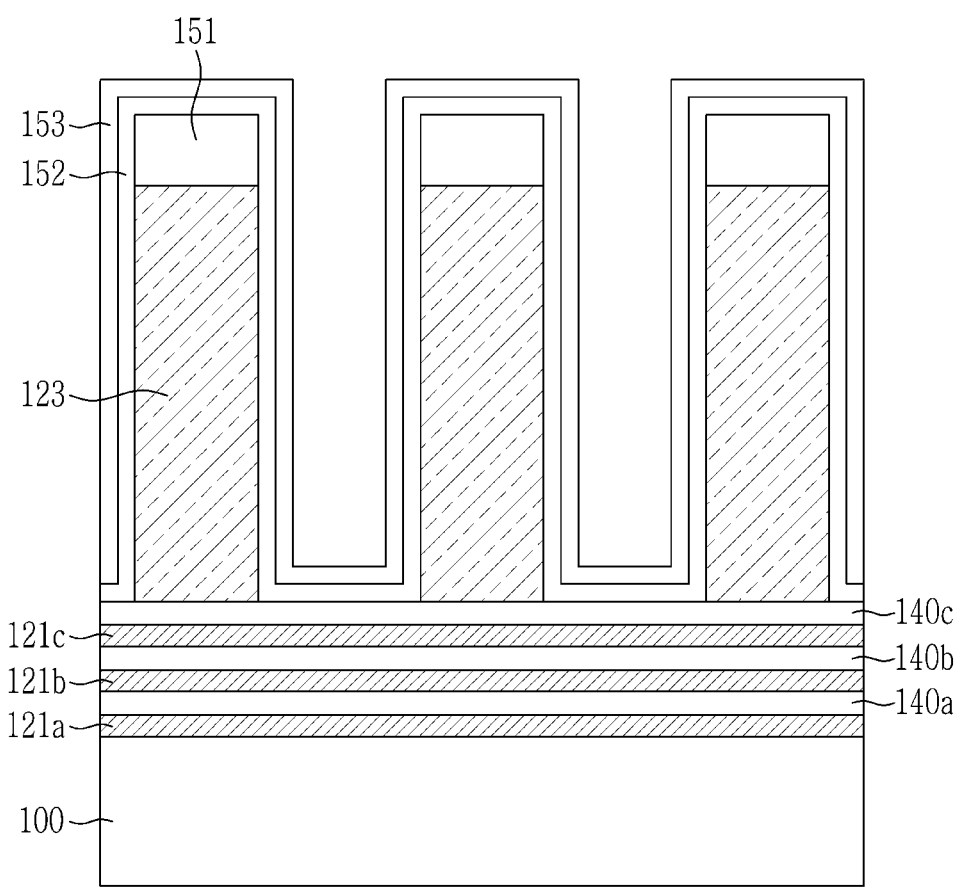
FIG. 1 to FIG. 11 each illustrate a process cross-sectional view sequentially illustrating a manufacturing method of a semiconductor device according to various example embodiments.

Various example embodiments will be described more fully hereinafter with reference to the accompanying drawings, in which some example embodiments are shown. As those of ordinary skill in the art would realize, variously described example embodiments may be modified in various different ways, all without departing from the spirit or scope of inventive concepts.

To clearly describe example embodiments, parts that are irrelevant to the description are omitted, and like numerals refer to like or similar constituent elements throughout the specification.

Further, since sizes and/or thicknesses of constituent members shown in the accompanying drawings may be arbitrarily given for better understanding and ease of description, example embodiments are not limited to the illustrated sizes and/or thicknesses. In the drawings, the thicknesses of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element, or intervening elements may also be present. In contrast, when an element is referred to as being "directly on" another element, at least partly there may be no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

Hereinafter, a manufacturing method of a semiconductor device according to various example embodiments will be described with reference to FIG. 1 to FIG. 11.

FIG. 1 to FIG. 11 each illustrate a process cross-sectional view sequentially illustrating a manufacturing method of a semiconductor device according to various example embodiments.

As illustrated in FIG. 1, a plurality of subgate sacrificial patterns 121a, 121b, and 121c and a plurality of semiconductor patterns 140a, 140b, and 140c are alternately stacked on a substrate 100.

The substrate 100 may be or may include a semiconductor material. For example, the substrate 100 may be or may include a group IV semiconductor, a group III-V compound semiconductor, a group II-VI compound semiconductor, and the like. For example, the substrate 100 may include a semiconductor such as Si and/or Ge, or a compound semiconductor such as SiGe, SiC, GaAs, InAs, or InP. The substrate 100 may have an upper surface that is parallel to a first direction (x direction) and a second direction (y direction), and may have a thickness that is parallel to a third direction (z direction) perpendicular to the first direction (x direction) and the second direction (y direction). The substrate 100 may be doped, or, alternatively, may be undoped.

The subgate sacrificial patterns 121a, 121b, and 121c may include a number of subgate sacrificial patterns such as a first subgate sacrificial pattern 121a, a second subgate sacrificial pattern 121b, and a third subgate sacrificial pattern 121c. The semiconductor patterns 140a, 140b, and 140c may include a number of semiconductor patterns such as a first semiconductor pattern 140a, a second semiconductor pattern 140b, and a third semiconductor pattern 140c. For example, first, the first subgate sacrificial pattern 121a may be on or formed on the upper surface of the substrate 100, and the first semiconductor pattern 140a may be formed on the first subgate sacrificial pattern 121a. Subsequently, the second subgate sacrificial pattern 121b, the second semiconductor pattern 140b, the third subgate sacrificial pattern 121c, and the third semiconductor pattern 140c may be sequentially formed on the first semiconductor pattern 140a. Although it has been described above that three subgate sacrificial patterns 121a, 121b, and 121c and three semiconductor patterns 140a, 140b, and 140c are alternately stacked, this is only an example and may be variously changed. For example, a number of stacked subgate sacrificial patterns 121a, 121b, and 121c or a number of stacked semiconductor patterns 140a, 140b, and 140c may be less than three or more than three. A thickness of each of the subgate sacrificial patterns 121a, 121b, and 121c may be the same as each other, or at least one of the subgate sacrificial patterns 121a, 121b, and 121c may have a thickness different than another one of the subgate sacrificial patterns 121a, 121b, and 121c. A thickness of each of the semiconductor patterns 140a, 140b, and 140c may be the same each other, or at least one of the semiconductor patterns 140a, 140b, and 140c may have a thickness different than another of the semiconductor patterns 140a, 140b, and 140c. A thickness of the semiconductor patterns 140a, 140b, and 140c may be the same, or different, than a corresponding thickness of the subgate sacrificial patterns 121a, 121b, and 121c.

The subgate sacrificial patterns 121a, 121b, and 121c and the semiconductor patterns 140a, 140b, and 140c may be formed by a deposition process such as a chemical vapor deposition process, and/or an epitaxial process such as by using an epitaxial growth method. The subgate sacrificial patterns 121a, 121b, and 121c may be made of a same material as each other; however, example embodiments are not limited thereto. The semiconductor patterns 140a, 140b, and 140c may be made of a same material as each other; however, example embodiments are not limited thereto. The subgate sacrificial patterns 121a, 121b, and 121c may be formed of a different material from that of the semiconductor patterns 140a, 140b, and 140c. For example, the subgate sacrificial patterns 121a, 121b, and 121c may be made of SiGe such as epitaxial SiGe, and the semiconductor patterns 140a, 140b, and 140c may be made of Si such as epitaxial Si. In this case, the subgate sacrificial patterns 121a, 121b, and 121c may be made of SiGe containing Ge of a medium concentration. In a case of low concentration, a Ge content may be defined as 0 at % or 1 at % to about 15 at %, in a case of medium concentration, the Ge content may be defined as about 15 at % to about 35 at %, and in a case of high concentration, the Ge content may be defined as about 35% or more. However, example embodiments are not limited thereto, and materials of the subgate sacrificial patterns 121a, 121b, and 121c and the semiconductor patterns 140a, 140b, and 140c may be variously changed. The subgate sacrificial patterns 121a, 121b, and 121c and the semiconductor patterns 140a, 140b, and 140c may extend in a first direction (x direction).

Subsequently, a main gate sacrificial pattern 123 and a capping layer 151 are formed on a stacked structure of the subgate sacrificial patterns 121a, 121b, and 121c and the semiconductor patterns 140a, 140b, and 140c. A capping layer 151 is formed by sequentially stacking a material layer for forming the main gate sacrificial pattern 123 and a material layer for forming the capping layer 151 on the stacked structure of the subgate sacrificial patterns 121a, 121b, and 121c and the semiconductor patterns 140a, 140b, and 140c, and then patterning them. Subsequently, the main gate sacrificial pattern 123 is formed by patterning a material layer for forming the main gate sacrificial pattern 123 using the capping layer 151 as a mask. Accordingly, the capping layer 151 may have a shape covering an upper surface of the main gate sacrificial pattern 123, and the main gate sacrificial pattern 123 may have a shape similar to that of the capping layer 151 in a plan view.

The main gate sacrificial pattern 123 may be positioned between the third semiconductor pattern 140c and the capping layer 151. The main gate sacrificial pattern 123 may be positioned directly on the third semiconductor pattern 140c. However, example embodiments are not limited thereto, and another layer may be further positioned between the main gate sacrificial pattern 123 and the third semiconductor pattern 140c. For example, an oxide layer may be further positioned between the main gate sacrificial pattern 123 and the third semiconductor pattern 140c.

The main gate sacrificial pattern 123 and the capping layer 151 may cross the extension direction of the subgate sacrificial patterns 121a, 121b, and 121c and the semiconductor patterns 140a, 140b, and 140c. For example, the main gate sacrificial pattern 123 and the capping layer 151 may extend in a second direction (y direction). A plurality of main gate sacrificial patterns 123 may be positioned to be spaced apart by a predetermined interval along the first direction (x direction).

The main gate sacrificial pattern 123 may include polysilicon such as doped or undoped polysilicon, and the capping layer 151 may include a silicon nitride. However, example embodiments are not limited thereto, and materials of the main gate sacrificial pattern 123 and the capping layer 151 may be variously changed.

Subsequently, a first spacer 152 and a second spacer 153 are sequentially formed, e.g. conformally formed, on the stacked structure of the subgate sacrificial patterns 121a, 121b, and 121c and the semiconductor patterns 140a, 140b, and 140c, the main gate sacrificial pattern 123, and the capping layer 151. The first spacer 152 may be positioned to cover an upper surface of the third semiconductor pattern 140c between the main gate sacrificial patterns 123. The first spacer 152 may cover a side surface of the main gate sacrificial pattern 123, and may cover a side surface and an upper surface of the capping layer 151. The second spacer 153 may be formed to cover the first spacer 152. The first spacer 152 and the second spacer 153 may each include a silicon nitride. However, example embodiments are not limited thereto, and materials of the first spacer 152 and the second spacer 153 may be variously changed. For example, at least one of the first spacer 152 and the second spacer 153 may be made of SiOCN and/or the like.

Figure 2:
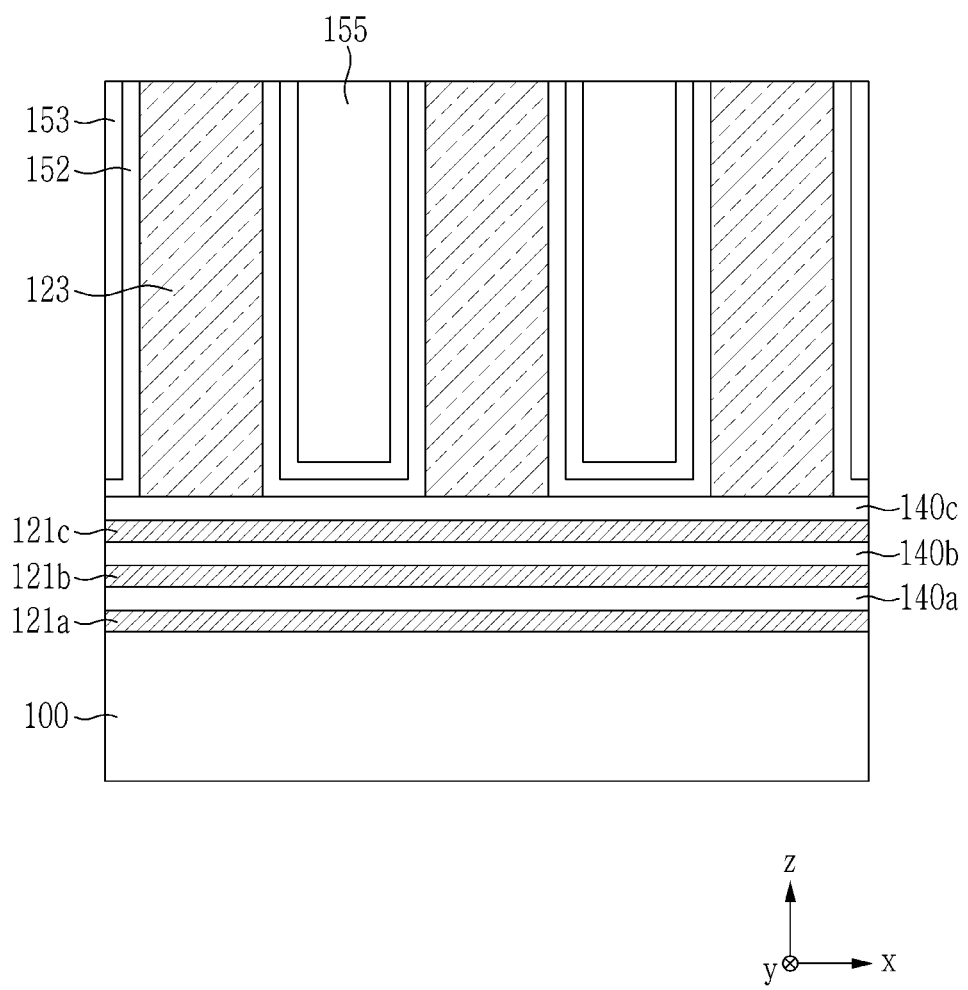

As illustrated in FIG. 2, an insulating layer 155 is formed to fill regions between the main gate sacrificial patterns 123. The insulating layer 155 may be made of a material capable of filling empty spaces well as an insulating material. For example, the insulating layer 155 may include a silicon oxide, tonen silazene (TOSZ), or the like.

Subsequently, an upper surface of the insulation layer 155 is planarized, e.g. through an etch-back process and/or a chemical mechanical polishing (CMP) process. In this case, the capping layer 151, the first spacer 152, and the second spacer 153 positioned on the main gate sacrificial pattern 123 may be removed by a planarization or polishing process. The polishing process may be performed until the upper surface of the main gate sacrificial pattern 123 is exposed to the outside, and the upper surface of the main gate sacrificial pattern 123 and the upper surface of the insulation layer 155 may be made flat. In this case, the first spacer 152 and the second spacer 153 may be positioned between the main gate sacrificial pattern 123 and the insulation layer 155.

Figure 3:
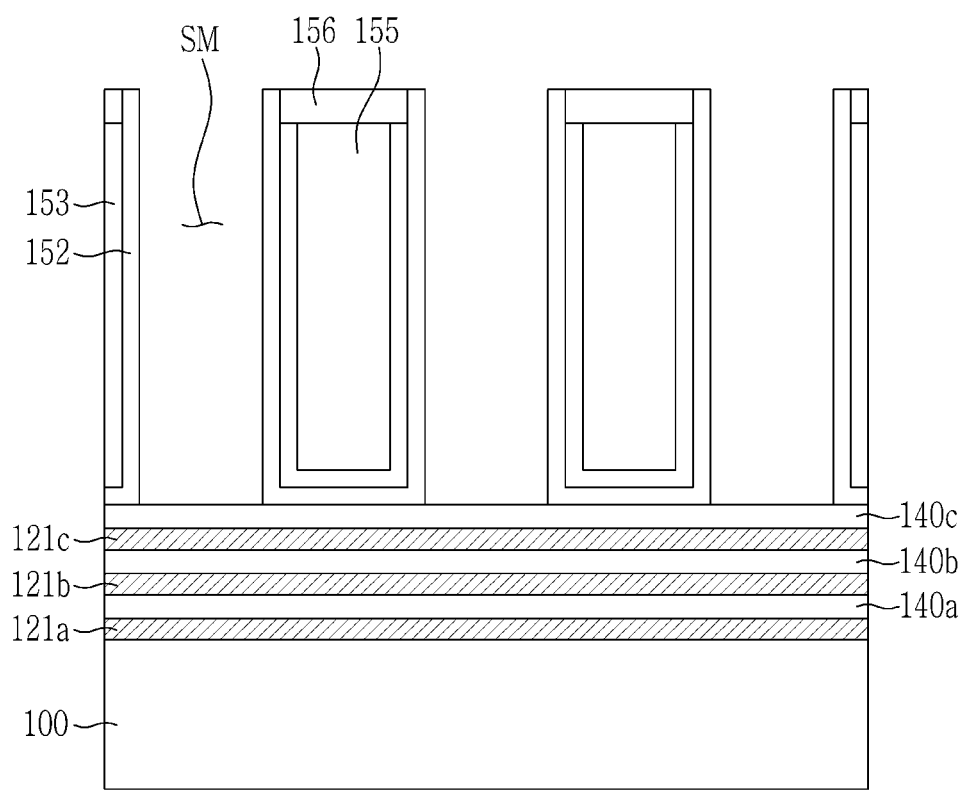

As illustrated in FIG. 3, an upper region of the insulating layer 155 may be removed by a thickness such as a dynamically determined (or, alternatively, a predetermined) thickness to form a groove, and a capping layer 156 may be formed in the groove. In this case, in the process of removing a portion of the insulating layer 155, the second spacer 153 may also be removed to correspond to a thickness of the portion from which the insulating layer 155 is removed. The capping layer 156 may fill a region where the insulation layer 155 and the second spacer 153 are removed. The capping layer 156 may be positioned on the insulation layer 155 and the second spacer 153. Upper surfaces of the insulating layer 155 and the second spacer 153 may be covered by the capping layer 156. The capping layer 156 may include a silicon nitride. However, a material of the capping layer 156 is not limited thereto, and may be variously changed. Subsequently, the upper surface of the capping layer 156 may be planarized, e.g. with a CMP process and/or an etch-back process, and thus the upper surfaces of the capping layer 156 and the first spacer 152 may be planarized.

Next, the main gate sacrificial pattern 123 having an exposed upper surface is removed. In this case, the main gate sacrificial pattern 123 may be removed using a wet etching process. A space SM is formed in a portion where the main gate sacrificial pattern 123 is positioned, and the first spacer 152, the subgate sacrificial patterns 121a, 121b, and 121c, and the semiconductor patterns 140a, 140b, and 140c that are in contact with the main gate sacrificial pattern 123 may be exposed to the outside. In this case, the exposed portion may remain without being affected by an etching solution.

Figure 4:
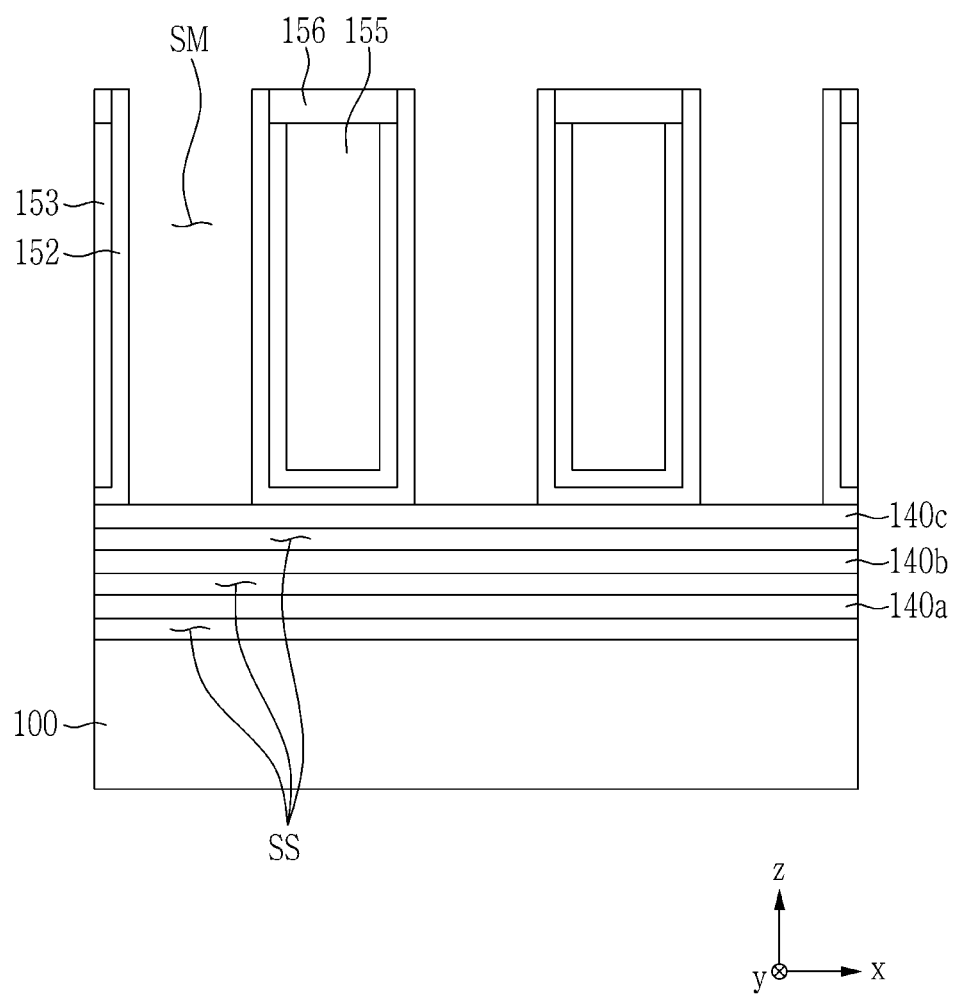

As illustrated in FIG. 4, the exposed subgate sacrificial patterns 121a, 121b, and 121c are removed. In this case, the subgate sacrificial patterns 121a, 121b, and 121c may be removed by using an etching process such as wet etching process and/or a dry-etching process. An etchant may be selected and used to selectively remove only the subgate sacrificial patterns 121a, 121b, and 121c in a state in which the subgate sacrificial patterns 121a, 121b, and 121c and the semiconductor patterns 140a, 140b, and 140c are all exposed. For example, the etchant used to remove the subgate sacrificial patterns 121a, 121b, and 121c may have a relatively high etching rate with respect to the material of the subgate sacrificial patterns 121a, 121b, and 121c. As described above, the subgate sacrificial patterns 121a, 121b, and 121c may be made of SiGe having a medium concentration of Ge, and the semiconductor patterns 140a, 140b, and 140c may be made of Si. In this case, the subgate sacrificial patterns 121a, 121b, and 121c may be selectively etched by performing an etching process using an etchant having a higher etching rate for SiGe than for Si, e.g. by using a wet chemical such as but not limited to one or more of acetic acid (CH3COOH), hydrogen peroxide ($H_2O_2$), and hydrofluoric acid (HF). Accordingly, the semiconductor patterns 140a, 140b, and 140c remain, and a space SS may be formed between the plurality of semiconductor patterns 140a, 140b, and 140c. For example, the space SS may be formed in a portion where the subgate sacrificial patterns 121a, 121b, and 121c are positioned.

Figure 5:
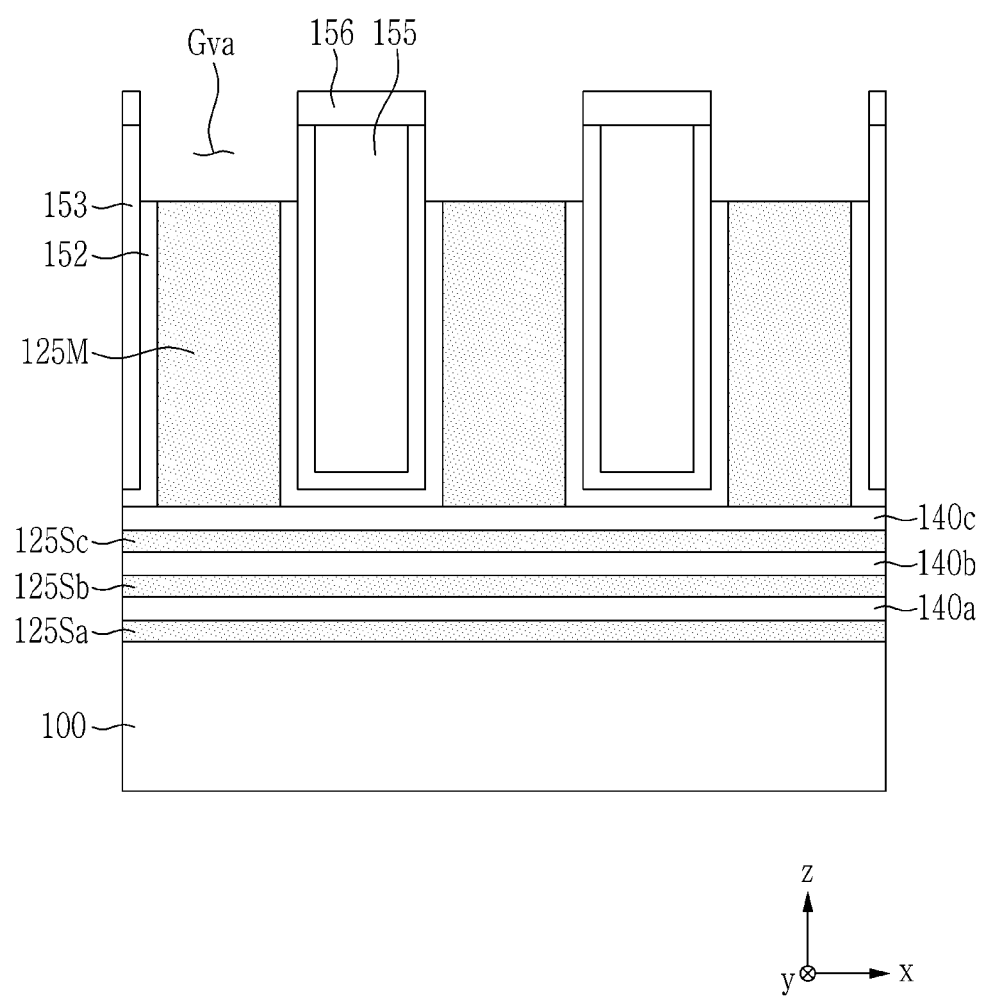

As illustrated in FIG. 5, a plurality of subgate dummy patterns 125Sa, 125Sb, and 125Sc and a main gate dummy pattern 125M are formed in spaces SM and SS formed by etching. The subgate dummy patterns 125Sa, 125Sb, and 125Sc and the main gate dummy pattern 125M may be formed by using one or more of an atomic layer deposition (ALD) process, a chemical vapor deposition (CVD) process, or the like. However, example embodiments are not limited thereto, and the subgate dummy patterns 125Sa, 125Sb, and 125Sc and the main gate dummy pattern 125M may be formed in various other ways.

The subgate dummy patterns 125Sa, 125Sb, and 125Sc are positioned in the space SS from which the subgate sacrificial patterns 121a, 121b, and 121c are removed. The subgate dummy patterns 125Sa, 125Sb, and 125Sc may include a first subgate dummy pattern 125Sa, a second subgate dummy pattern 125Sb, and a third subgate dummy pattern 125Sc. The first subgate dummy pattern 125Sa is positioned at a portion where the first subgate sacrificial pattern 121a is removed, the second subgate dummy pattern 125Sb is positioned at a portion where the second subgate sacrificial pattern 121b is removed, and the third subgate dummy pattern 125Sc is positioned at a portion where the third subgate sacrificial pattern 121c is removed. Accordingly, a plurality of semiconductor patterns 140a, 140b, and 140c and the subgate dummy patterns 125Sa, 125Sb, and 125Sc may be alternately stacked. The first semiconductor pattern 140a, the second subgate dummy pattern 125Sb, the second semiconductor pattern 140b, the third subgate dummy pattern 125Sc, and the third semiconductor pattern 140c may be sequentially positioned on the first subgate dummy pattern 125Sa.

The main gate dummy pattern 125M is positioned in the space SM from which the main gate sacrificial pattern 123 is removed. The main gate dummy pattern 125M is positioned on the third semiconductor pattern 140c, and is positioned between the first spacers 152.

The subgate dummy patterns 125Sa, 125Sb, and 125Sc and the main gate dummy pattern 125M may be formed of a same material, or at least one of the 125Sa, 125Sb, and 125Sc may include at least one material not included in others of the 125Sa, 125Sb, and 125Sc. The subgate dummy patterns 125Sa, 125Sb, and 125Sc and the main gate dummy pattern 125M may be formed of a different material from that of the subgate sacrificial patterns 121a, 121b, and 121c. In addition, the subgate dummy patterns 125Sa, 125Sb, and 125Sc and the main gate dummy pattern 125M may be formed of a different material from the semiconductor patterns 140a, 140b, and 140c and a source/drain pattern (170 in FIG. 8) to be formed in a subsequent process. In particular, the subgate dummy patterns 125Sa, 125Sb, and 125Sc and the main gate dummy pattern 125M may be made of a material having high selectivity with respect to the semiconductor patterns 140a, 140b, and 140c and the source/drain pattern (170 in FIG. 8). For example, the subgate dummy patterns 125Sa, 125Sb, and 125Sc and the main gate dummy pattern 125M may each include a silicon oxide.

Subsequently, upper surfaces of a plurality of main gate dummy patterns 125M may be planarized, e.g. by using an etch-back process and/or a chemical mechanical polishing (CMP) process. Subsequently, an upper region of the main gate dummy pattern 125M may be removed by a thickness, such as a dynamically determined (or, alternatively, predetermined) thickness to form a groove Gva. In this case, the first spacer 152 may also be removed to correspond to the thickness of the portion from which the main gate dummy pattern 125M is removed. A depth of the groove Gva may be greater than the thickness of the capping layer 156 covering the insulating layer 155.

Figure 6:
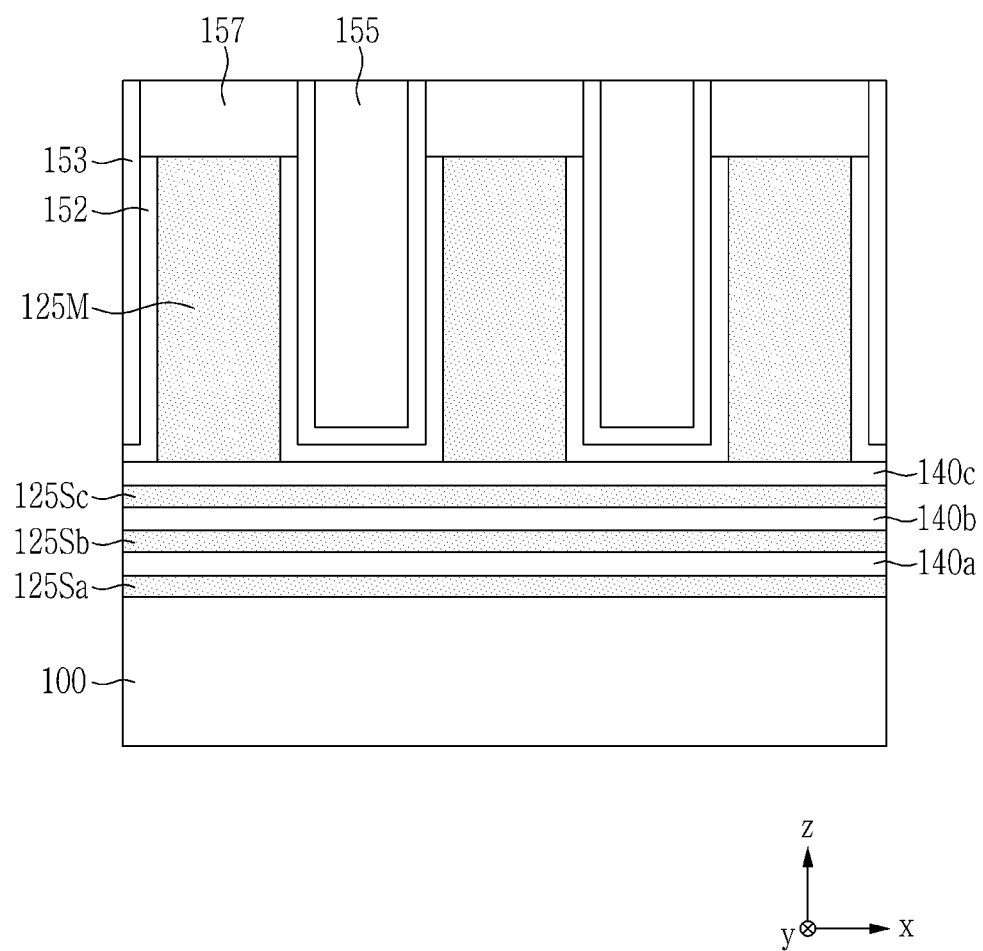

As illustrated in FIG. 6, the capping layer 157 may be formed in the groove Gva that is formed by removing the main gate dummy pattern 125M and the first spacer 152. The capping layer 157 may be positioned on the main gate dummy pattern 125M and the first spacer 152. The upper surfaces of the main gate dummy pattern 125M and the first spacer 152 may be covered by the capping layer 157. The capping layer 157 may include a silicon nitride. However, a material of the capping layer 157 is not limited thereto, and may be variously changed.

Subsequently, a thickness of the capping layer 157 may be reduced by using a planarization process such as an etch-back process and/or a chemical mechanical polishing (CMP) process. In this case, the capping layer 156 positioned on the insulating layer 155 may be removed. A polishing process may be performed until an upper surface of the insulating layer 155 is exposed. Accordingly, upper surfaces of the capping layer 157 and the insulation layer 155 may be planarized.

Figure 7:
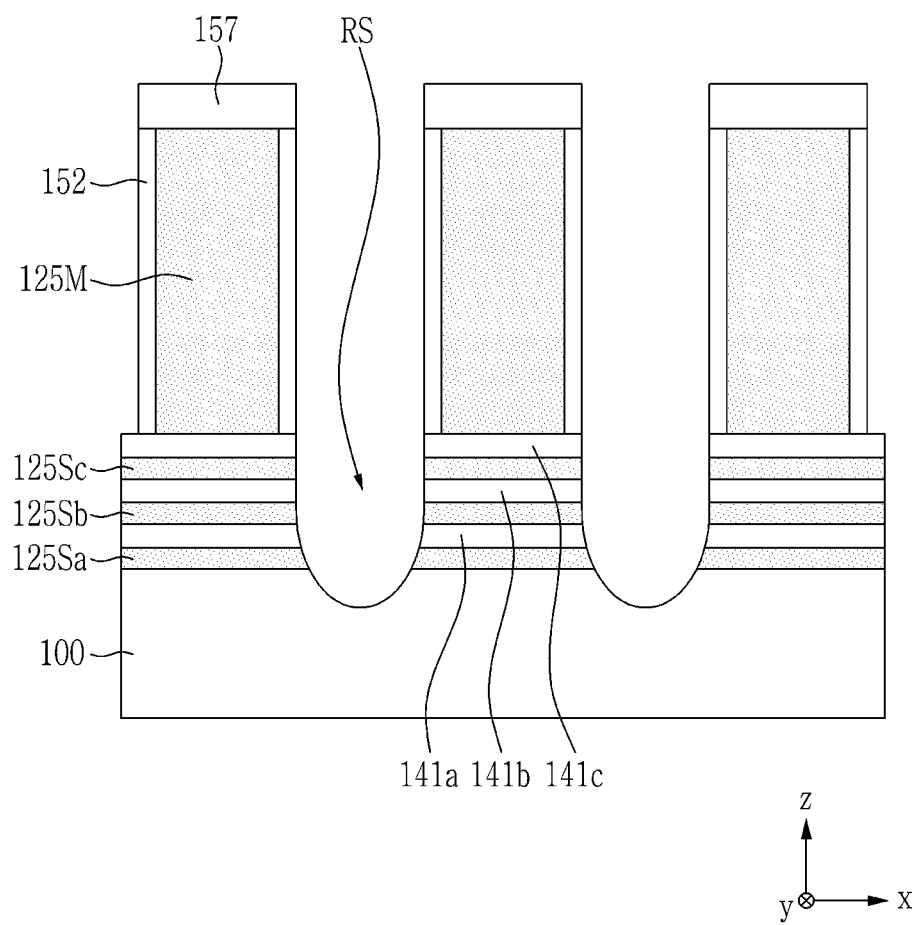

As illustrated in FIG. 7, the exposed insulating layer 155 is removed by using an etching process such as a dry and/or a wet etching process. In this case, the second spacer 153 surrounding the insulating layer 155 may be removed together. When the insulating layer 155 and the second spacer 153 are removed, the third semiconductor pattern 140c may be exposed to the outside.

Subsequently, by using the main gate dummy pattern 125M, the capping layer 157, and the first spacer 152 as a mask, the semiconductor patterns 140a, 140b, and 140c and the subgate dummy patterns 125Sa, 125Sb, and 125Sc are etched, e.g. with a wet and/or dry etching process, to form a recess Rs. The third semiconductor pattern 140c, the third subgate dummy pattern 125Sc, the second semiconductor pattern 140b, the second subgate dummy pattern 125Sb, the first semiconductor pattern 140a, and the first subgate dummy pattern 125Sa may be sequentially exposed and removed. As the recess Rs is formed, side surfaces of the semiconductor patterns 140c and the subgate dummy patterns 125Sa, 125Sb, and 125Sc may be exposed to the outside. In addition, an upper surface of the substrate 100 may be exposed to the outside, and the upper surface of the substrate 100 may be partially etched.

As the recess Rs is formed, the semiconductor patterns 140a, 140b, and 140c may be separated to form a plurality of channel patterns 141a, 141b, and 141c. The channel patterns 141a, 141b, and 141c may be positioned at opposite sides of the recess Rs. The channel patterns 141a, 141b, and 141c may include a number of patterns such as a first channel pattern 141a, a second channel pattern 141b, and a third channel pattern 141c. The channel patterns 141a, 141b, and 141c and a plurality of subgate dummy patterns 125Sa, 125Sb, and 125Sc may be alternately stacked. The first channel pattern 141a, the second subgate dummy pattern 125Sb, the second channel pattern 141b, the third subgate dummy pattern 125Sc, and the third channel pattern 141c may be sequentially positioned on the first subgate dummy pattern 125Sa. In this case, lengths (e.g. horizontal lengths in the x direction) of the first channel pattern 141a, the second channel pattern 141b, and the third channel pattern 141c may be different. For example, a length of the first channel pattern 141a may be the longest, a length of the second channel pattern 141b may be shorter than that of the first channel pattern 141a, and a length of the third channel pattern 141c may be shorter than that of the second channel pattern 141b. However, example embodiments are not limited thereto, and the lengths of first channel pattern 141a, second channel pattern 141b, and third channel pattern 141c may be substantially equivalent.

Figure 8:
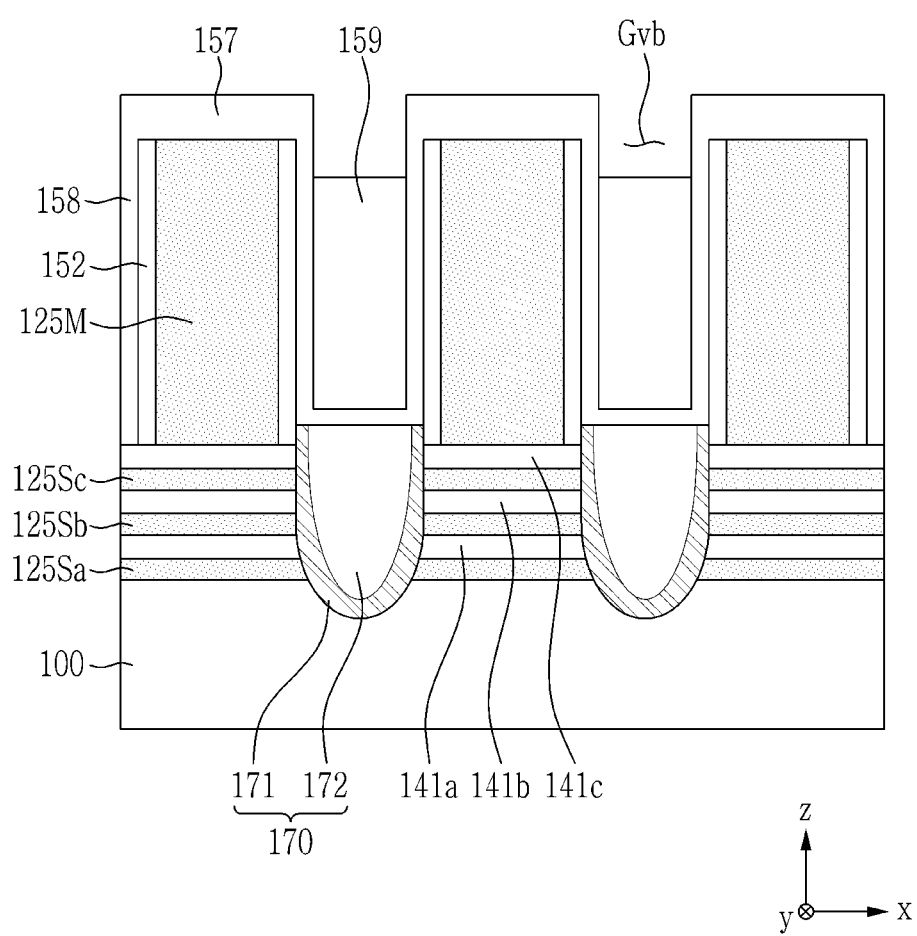

As illustrated in FIG. 8, a source/drain pattern 170 is formed in the recess Rs. The source/drain pattern 170 may be formed by using an epitaxial growth method such as a homogeneous and/or heterogenous epitaxial growth method. In this case, an inner wall of the recess Rs may be used as a seed. The inner wall of the recess Rs is formed to include the side surfaces of the channel patterns 141a, 141b, and 141c, and the subgate dummy patterns 125Sa, 125Sb, and 125Sc, and the upper surface of the substrate 100.

The source/drain pattern 170 may include a first source/drain pattern 171 and a second source/drain pattern 172. First, the first source/drain pattern 171 is formed in the recess Rs, the second source/drain pattern 172 may be formed on the first source/drain pattern 171. The first source/drain pattern 171 may directly contact the channel patterns 141a, 141b, and 141c, the subgate dummy patterns 125Sa, 125Sb, and 125Sc, and the substrate 100. The second source/drain pattern 172 may not directly contact the channel patterns 141a, 141b, and 141c, the subgate dummy patterns 125Sa, 125Sb, and 125Sc, and the substrate 100. The first source/drain pattern 171 may be positioned between the second source/drain pattern 172 and the channel patterns 141a, 141b, and 141c. The first source/drain pattern 171 may be positioned between the second source/drain pattern 172 and the subgate dummy patterns 125Sa, 125Sb, and 125Sc. The first source/drain pattern 171 may be positioned between the second source/drain pattern 172 and the substrate 100.

The source/drain pattern 170 may include SiGe. A Ge content of the first source/drain pattern 171 may be different from that of the second source/drain pattern 172. The first source/drain pattern 171 may be made of SiGe containing a low concentration of Ge, and the second source/drain pattern 172 may be made of SiGe containing a high concentration of Ge. The Ge content of the first source/drain pattern 171 may be lower than or less than that of the second source/drain pattern 172. A difference between the Ge content of the first source/drain pattern 171 and the Ge content of the second source/drain pattern 172 may be about 20% or more. However, a material of the source/drain pattern 170 is not limited thereto, and may be variously changed. In some example embodiments, impurities may be included or incorporated into either or both of the first source/drain pattern 171 and the second source/drain pattern 172. The impurities may be incorporated in-situ, and/or may be implanted into the first and/or second source drain patterns 171 and 172.

Next, a protective layer 158 is formed on the source/drain pattern 170. The protective layer 158 may be formed by using one or more of an atomic layer deposition (ALD) process, a chemical vapor deposition (CVD) process, or the like. The protective layer 158 may be integrally formed by being connected to the capping layer 157. An upper surface of the source/drain pattern 170 and a side surface of the first spacer 152 may be covered by the protective layer 158.

Next, an insulation layer 159 is formed on the protective layer 158. The insulation layer 159 may be formed to fill a region between the main gate dummy patterns 125M. The insulating layer 159 may be made of a material capable of filling empty spaces well as an insulating material. For example, the insulating layer 159 may include one or more of a silicon oxide, tonen silaZene (TOSZ), or the like.

Subsequently, an upper surface of the insulation layer 159 is planarized by using an etch-back process and/or a chemical mechanical polishing (CMP) process. In addition, an upper region of the insulation layer 159 is removed by a certain thickness to form a groove Gvb.

Figure 9:
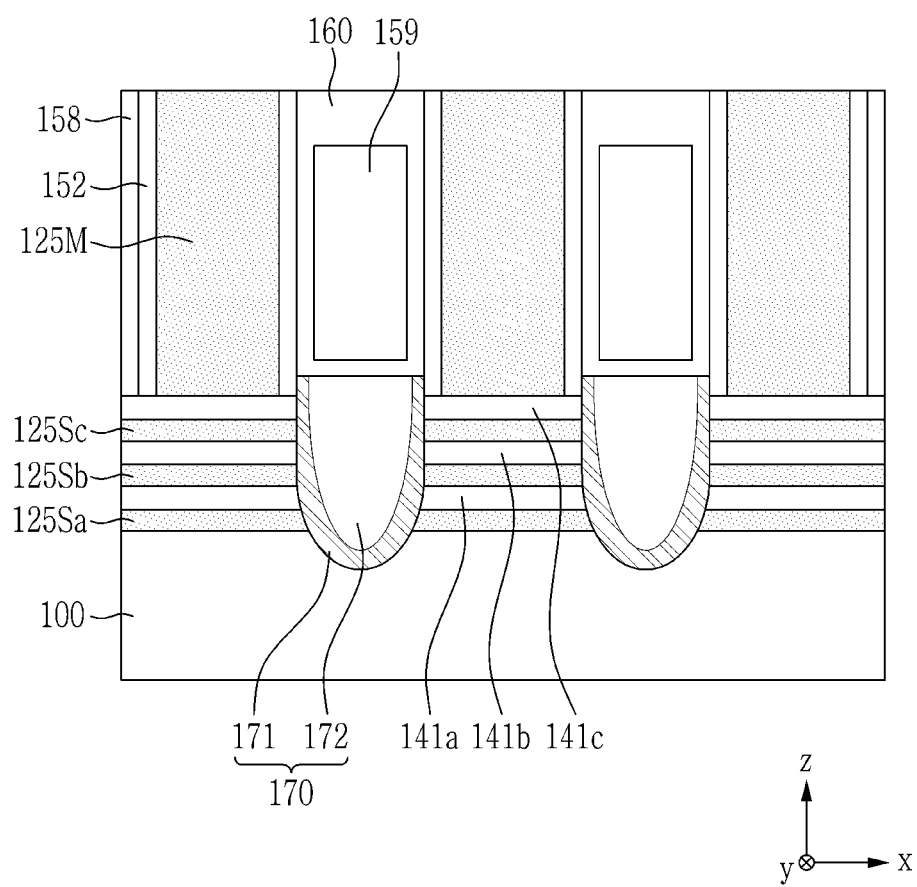

As illustrated in FIG. 9, a capping layer 160 is formed in the groove Gvb. The capping layer 160 may fill a region where the insulation layer 159 is removed. The capping layer 160 may be positioned on the insulating layer 159. An upper surface of the insulation layer 159 may be covered by the capping layer 160. The capping layer 160 may include a silicon nitride. However, a material of the capping layer 160 is not limited thereto, and may be variously changed.

Subsequently, a thickness of the capping layer 160 may be reduced by using the etch-back and/or CMP process. In this case, the capping layer 157 positioned on the main gate dummy pattern 125M may be removed. The planarization or polishing process may be performed until an upper surface of the main gate dummy pattern 125M is exposed. Accordingly, upper surfaces of the capping layer 160 and the main gate dummy pattern 125M may be planarized.

Figure 10:
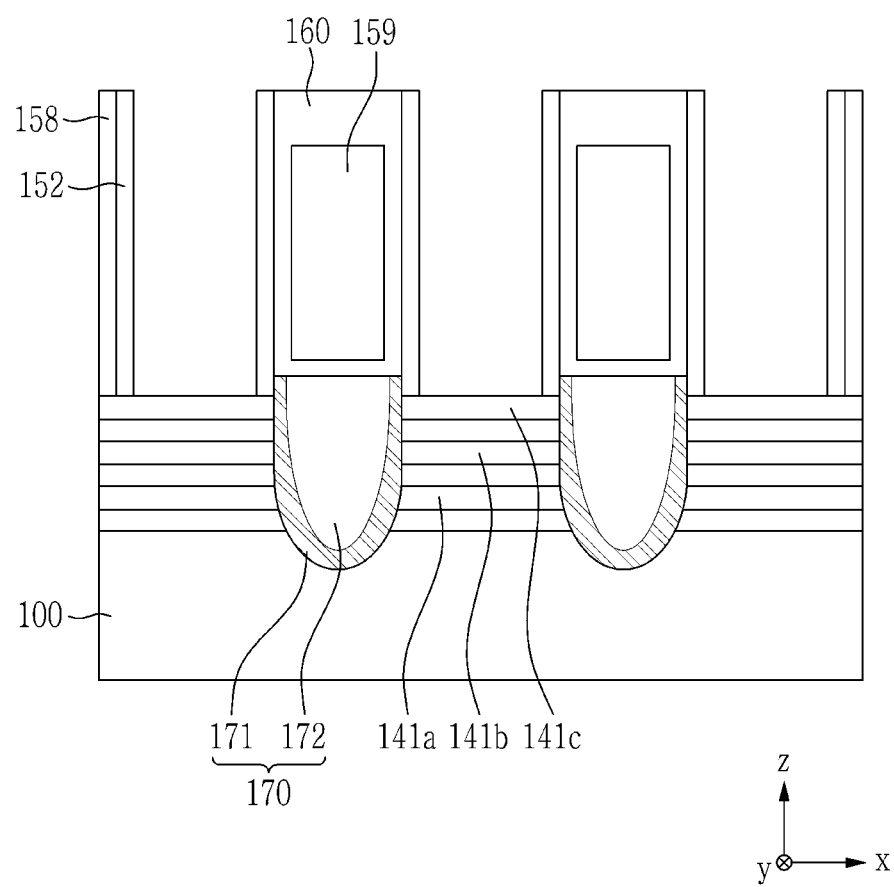

As illustrated in FIG. 10, the exposed main gate dummy pattern 125M is removed by using an etching process such as a wet etch process sand/or a dry etch process. While the main gate dummy pattern 125M is removed, a plurality of subgate dummy patterns 125Sa, 125Sb, and 125Sc may be exposed to the outside, and the plurality of subgate dummy patterns 125Sa, 125Sb, and 125Sc may be removed together.

The subgate dummy patterns 125Sa, 125Sb, and 125Sc and the main gate dummy pattern 125M are made of or may include a material having a high selectivity with respect to the channel patterns 141a, 141b, and 141c and the source/drain pattern 170. For example, the subgate dummy patterns 125Sa, 125Sb, and 125Sc and the main gate dummy pattern 125M may be made of a silicon oxide, the channel patterns 141a, 141b, and 141c may be made of Si, and the source/drain pattern 170 may be made of SiGe. The etching process may be performed by using an etchant such as a wet etchant having a relatively high etching rate for the silicon oxide. Accordingly, the main gate dummy pattern 125M and the subgate dummy patterns 125Sa, 125Sb, and 125Sc are removed, and the channel patterns 141a, 141b, and 141c and the source/drain pattern 170 remain.

Figure 11:
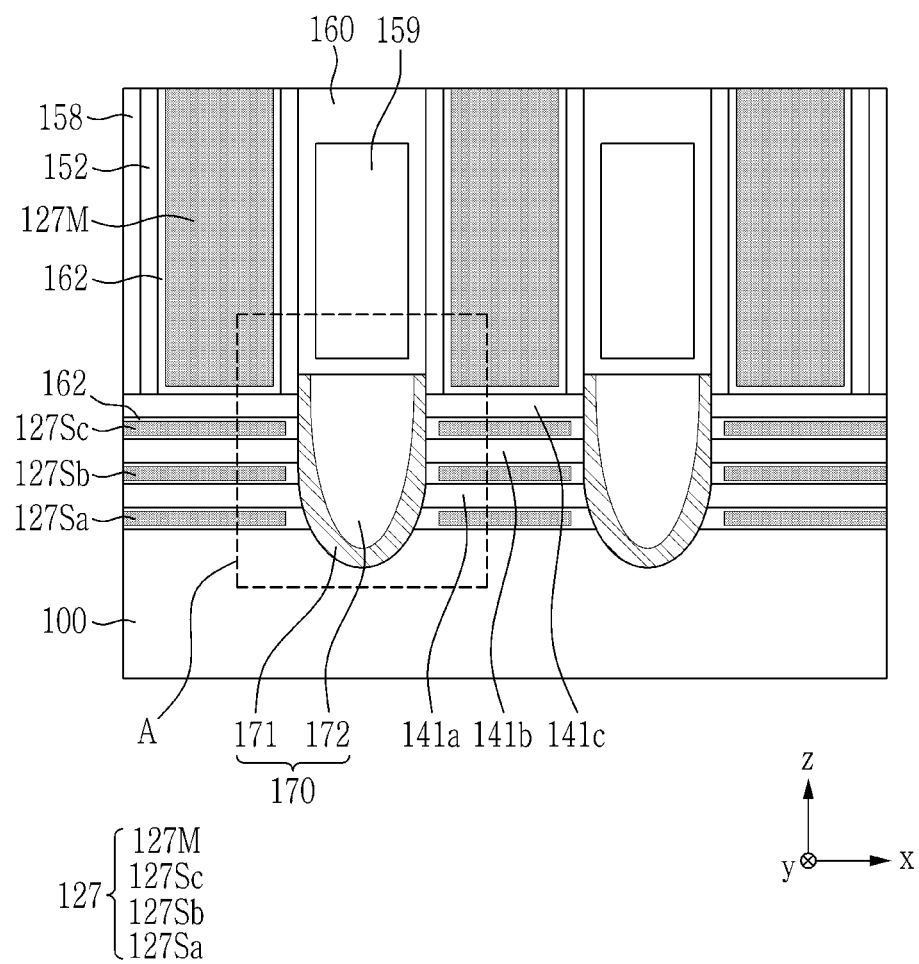

As illustrated in FIG. 11, a gate insulating layer 162 is formed in a space where the main gate dummy pattern 125M and the subgate dummy patterns 125Sa, 125Sb, and 125Sc are removed, and a gate electrode 127 is formed on the gate insulating layer 162. The gate electrode 127 may include a plurality of subgate electrodes 127Sa, 127Sb, and 127Sc and a main gate electrode 127M.

The gate insulating layer 162 may be conformally formed on a surface exposed by a space from which the main gate dummy pattern 125M and the subgate dummy patterns 125Sa, 125Sb, and 125Sc are removed. The gate insulating layer 162 may be positioned on exposed surfaces of the channel patterns 141a, 141b, and 141c. In addition, the gate insulating layer 162 may be positioned on an exposed surface of the source/drain pattern 170. In addition, the gate insulating layer 162 may be positioned on an exposed surface of the first spacer 152.

The gate insulating layer 162 may be formed by using one or more of an atomic layer deposition (ALD) process, a chemical vapor deposition (CVD) process, or a PVD process. The gate insulating layer 162 may include an oxide, a nitride, or a high dielectric constant (high-k) material. The gate insulating layer 162 may have a single layer or a multi-layer structure made of a combination of the materials. The high dielectric constant material may have a dielectric constant of about 10 to 25. For example, the high dielectric constant material may include one or more materials selected from a hafnium oxide, a hafnium oxynitride, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, and a lead zinc niobate, and a combination thereof. However, this is merely an example, and a material of the gate insulating layer 162 is not limited thereto.

The subgate electrodes 127Sa, 127Sb, and 127Sc are positioned in a space where the subgate dummy patterns 125Sa, 125Sb, and 125Sc are removed. The subgate electrodes 127Sa, 127Sb, and 127Sc are positioned on the gate insulating layer 162 and are formed to fill a space. The subgate electrodes 127Sa, 127Sb, and 127Sc may include a first subgate electrode 127Sa, a second subgate electrode 127Sb, and a third subgate electrode 127Sc. The first subgate electrode 127Sa is positioned at a portion where the first subgate dummy pattern 125Sa is removed, the second subgate electrode 127Sb is positioned at a portion where the second subgate dummy pattern 125Sb is removed, and the third subgate electrode 127Sc is positioned at a portion where the third subgate dummy pattern 125Sc is removed. Accordingly, a plurality of channel patterns 141a, 141b, and 141c and the subgate electrode 127Sa, 127Sb, and 127Sc may be alternately stacked. The first channel pattern 141a, the second subgate electrode 127Sb, the second channel pattern 141b, the third subgate electrode 125Sc, and the third channel pattern 141c may be sequentially positioned on the first subgate electrode 127Sa. The gate insulating layer 162 may be positioned between the respective subgate electrodes 127Sa, 127Sb, and 127Sc and the respective channel patterns 141a, 141b, and 141c. The gate insulating layer 162 may be positioned between the respective subgate electrodes 127Sa, 127Sb, and 127Sc and the source/drain pattern 170.

The main gate electrode 127M may be positioned in a space where the main gate dummy pattern 125M is removed. The main gate electrode 127M may be positioned on the gate insulating layer 162, and may be formed to fill a space. The gate insulating layer 162 may be positioned between the main gate electrode 127M and the first spacer 152.

The gate electrode 127 may be formed by using one or more of an atomic layer deposition (ALD) process, a chemical vapor deposition (CVD) process, or the like. The gate electrode 127 may include a doped polysilicon, a metal, a conductive metal nitride, a conductive metal carbide, or a combination thereof. However, this is merely an example, and a material of the gate electrode 127 is not limited thereto.

In a manufacturing method of a semiconductor device according to various example embodiments, a stacked structure of a plurality of subgate sacrificial patterns 121a, 121b, and 121c and a plurality of semiconductor patterns 140a, 140b, and 140c is formed, a main gate sacrificial pattern 123 is formed, and then the main gate dummy pattern 125M and the subgate dummy patterns 125Sa, 125Sb, and 125Sc are formed to replace the main gate sacrificial pattern 123 and the subgate sacrificial patterns 121a, 121b, and 121c. Subsequently, the source/drain patterns 170 are formed, and then gate electrodes 127 are formed to replace the main gate dummy patterns 125M and the subgate dummy patterns 125Sa, 125Sb, and 125Sc.

In a manufacturing method of a semiconductor device according to one or more reference embodiments, a stacked structure of a subgate sacrificial pattern and a semiconductor pattern may be formed, and a source/drain pattern may be formed after forming a main gate sacrificial pattern. Subsequently, a gate electrode may be formed to replace the main gate sacrificial pattern and the subgate sacrificial pattern. In this case, both the subgate sacrificial pattern and the source/drain pattern may include SiGe, and the source/drain pattern may be damaged in a process of removing the subgate sacrificial pattern.

In a manufacturing method of a semiconductor device according to various example embodiments, before the source/drain pattern 170 is formed, the main gate dummy pattern 125M and the subgate dummy patterns 125Sa, 125Sb, and 125Sc made of a silicon oxide may be formed to replace the main gate sacrificial pattern 123 made of polysilicon and the subgate sacrificial patterns 121a, 121b, 121c made of SiGe, thereby preventing or reducing the likelihood of and/or the impact from damage to the source/drain pattern 170. Since an etching selectivity of the silicon oxide and the SiGe is high, the source/drain pattern 170 may be prevented or reduced from being damaged in the process of removing the main gate dummy pattern 125M and the subgate dummy patterns 125Sa, 125Sb, and 125Sc. A material of the main gate dummy pattern 125M and the subgate dummy patterns 125Sa, 125Sb, and 125Sc is not limited to the silicon oxide, and a material having a high selectivity with respect to SiGe may be used.

Next, a semiconductor device according to various example embodiments will be described with reference to FIG. 12 and FIG. 13 along with FIG. 11.

Figure 12:
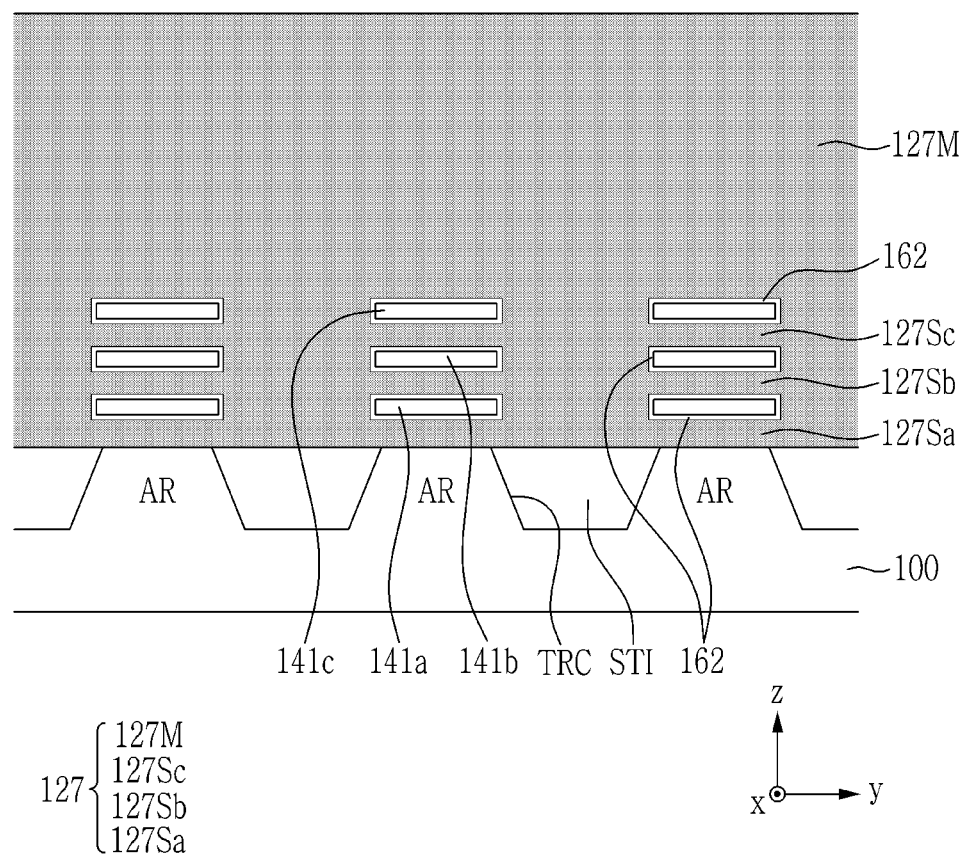
FIG. 12 illustrates a cross-sectional view showing a semiconductor device according to various example embodiments.
Figure 13:
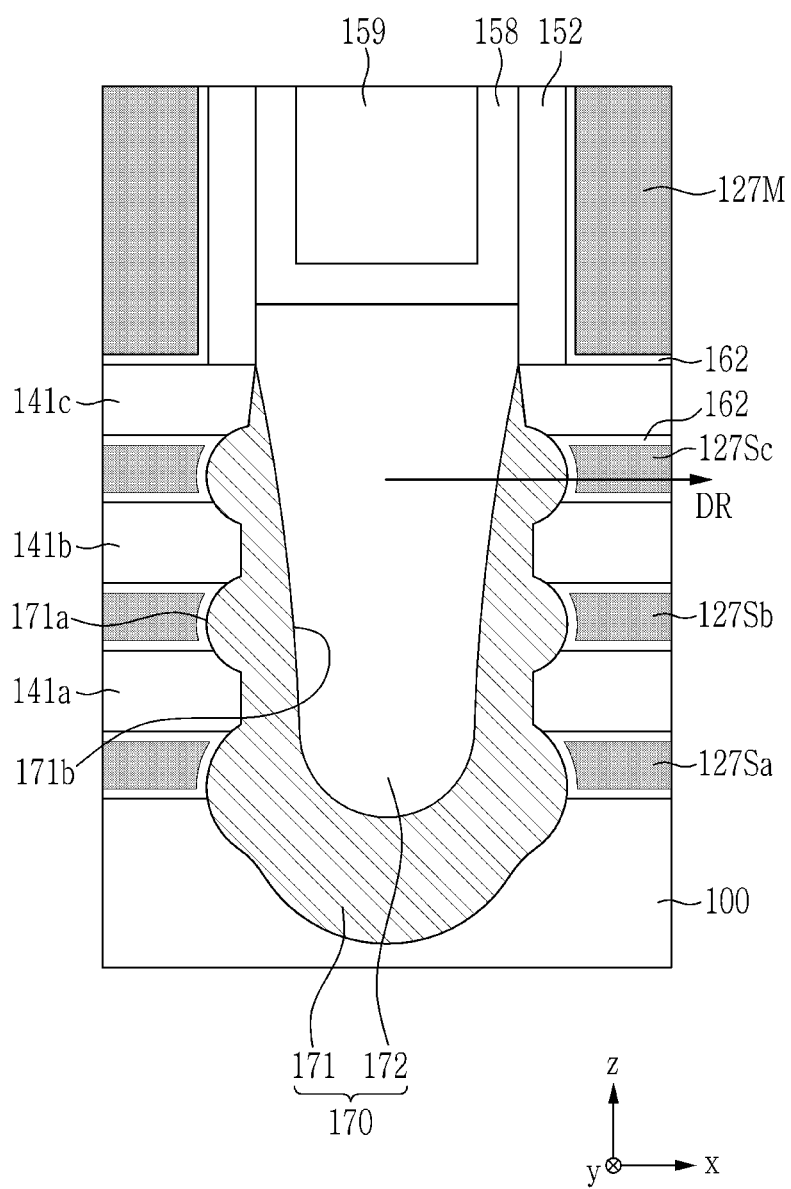
FIG. 13 illustrates an enlarged view of a region A of FIG. 11.

FIG. 12 illustrates a cross-sectional view showing a semiconductor device according to various example embodiments, and FIG. 13 illustrates an enlarged view of a region A of FIG. 11. FIG. 11 and FIG. 12 each illustrate a cross-sectional view showing states cut in different directions.

As illustrated in FIG. 11 to FIG. 13, according to various example embodiments, a semiconductor device includes a substrate 100, a plurality of channel patterns 141a, 141b, and 141c stacked apart from each other on the substrate 100, a gate electrode 127 surrounding the channel patterns 141a, 141b, and 141c, a gate insulating layer 162 positioned between the channel patterns 141a, 141b, and 141c and the gate electrode 127, and a source/drain patterns 170 positioned at opposite sides of the channel patterns 141a, 141b, and 141c.

The substrate 100 includes or defines a trench TRC defining a plurality of active regions AR, and an isolation layer STI may be positioned in the trench TRC. The active regions AR may have a fin shape. The active regions AR may extend along a first direction (x direction), and may be spaced apart from each other along a second direction (y direction). The isolation layer STI may be formed to fill the trench TRC. The isolation layer STI may include an insulating material. For example, the isolation layer STI may include a silicon oxide and/or a silicon nitride.

The channel patterns 141a, 141b, and 141c may be positioned on the active region AR. The channel patterns 141a, 141b, and 141c may include a first channel pattern 141a, a second channel pattern 141b, and a third channel pattern 141c. The second channel pattern 141b may be positioned on the first channel pattern 141a, and the third channel pattern 141c may be positioned on the second channel pattern 141b. The second channel pattern 141b is spaced apart from the first channel pattern 141a and the third channel pattern 141c. Thicknesses of the channel patterns 141a, 141b, and 141c may be substantially equivalent, and/or distances between the channel patterns 141a, 141b, and 141c may be substantially equivalent. However, example embodiments are not limited thereto, and the thickness of at least one of the channel patterns 141a, 141b, and 141c may be different, and the distances between the channel patterns 141a, 141b, and 141c may be different. The channel patterns 141a, 141b, and 141c may be made of Si.

However, example embodiments are not limited thereto, and materials of the channel patterns 141a, 141b, and 141c may be variously changed.

The gate electrode 127 may include a plurality of subgate electrodes 127Sa, 127Sb, and 127Sc and a main gate electrode 127M.

The subgate electrodes 127Sa, 127Sb, and 127Sc may be positioned under the channel patterns 141a, 141b, and 141c. The subgate electrodes 127Sa, 127Sb, and 127Sc may have a structure in which the channel patterns 141a, 141b, and 141c are alternately stacked. The subgate electrodes 127Sa, 127Sb, and 127Sc may include a first subgate electrode 127Sa, a second subgate electrode 127Sb, and a third subgate electrode 127Sc. A stacked structure in which the first channel pattern 141a, the second subgate electrode 127Sb, the second channel pattern 141b, the third subgate electrode 125Sc, and the third channel pattern 141c are sequentially positioned on the first subgate electrode 127Sa may be provided.

The main gate electrode 127M may be electrically connected to the subgate electrodes 127Sa, 127Sb, and 127Sc, and the main gate electrode 127M and the subgate electrodes 127Sa, 127Sb, and 127Sc may be integrally formed. The main gate electrode 127M may cover a stacked structure of the subgate electrodes 127Sa, 127Sb, and 127Sc and the channel patterns 141a, 141b, and 141c.

The gate insulating layer 162 may be formed to surround the channel patterns 141a, 141b, and 141c. The gate insulating layer 162 may be positioned between the channel patterns 141a, 141b, and 141c and the subgate electrodes 127Sa, 127Sb, and 127Sc. The gate insulating layer 162 may be positioned between the channel patterns 141a, 141b, and 141c and the main gate electrode 127M.

The source/drain pattern 170 may contact side surfaces of the channel patterns 141a, 141b, and 141c. Accordingly, the source/drain pattern 170 may be connected to the channel patterns 141a, 141b, and 141c. The source/drain pattern 170 may include a first source/drain pattern 171 and a second source/drain pattern 172. The first source/drain pattern 171 may have a shape surrounding side and lower surfaces of the second source/drain pattern 172. The channel patterns 141a, 141b, and 141c may contact the first source/drain pattern 171, and may not contact the second source/drain pattern 172. Accordingly, the first source/drain pattern 171 may be positioned between the channel patterns 141a, 141b, and 141c and the second source/drain pattern 172. However, example embodiments are not limited thereto, and at least a portion of the channel patterns 141a, 141b, and 141c may contact the second source/drain pattern 172. Alternatively or additionally, the source/drain pattern 170 may be formed of a single layer instead of being divided into the first source/drain pattern 171 and the second source/drain pattern 172.

The first source/drain pattern 171 may include an outer surface 171a in contact with the channel patterns 141a, 141b, and 141c, the gate insulating layer 162, and the substrate 100, and an inner surface 171b in contact with the second source/drain pattern 172. The outer surface 171a of the first source/drain pattern 171 may be formed as an uneven surface. A portion of the outer surface 171a of the first source/drain pattern 171 contacting the channel patterns 141a, 141b, and 141c may have a substantially flat or concave shape in a cross-sectional view. A portion of the outer surface 171a of the first source/drain pattern 171 contacting the gate insulating layer 162 may have a convex shape. In a manufacturing method of a semiconductor device according to various example embodiments, after forming the recess Rs, a process of selectively etching the subgate dummy patterns 125Sa, 125Sb, and 125Sc may be further performed, thereby forming the recess Rs to have a bumpy shape. Accordingly, the shape of the outer surface 171a of the first source/drain pattern 171 may be determined. The inner surface 171b of the first source/drain pattern 172 may be flat in a cross-sectional view.

The source/drain pattern 170 may include SiGe. A Ge content of the first source/drain pattern 171 may be different from that of the second source/drain pattern 172. The first source/drain pattern 171 may be made of SiGe containing a low concentration of Ge, and the second source/drain pattern 172 may be made of SiGe containing a high concentration of Ge. However, a material of the source/drain pattern 170 is not limited thereto, and may be variously changed.

Hereinafter, the concentration distribution of Ge from the center of the source/drain pattern 170 along the first direction (x direction) will be described as follows with further reference to FIG. 14.

Figure 14:
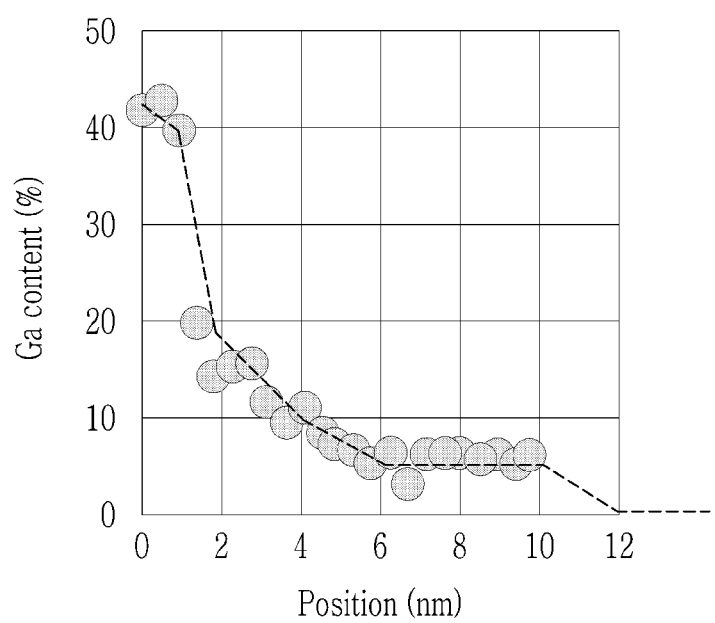
FIG. 14 illustrates a concentration distribution of Ge in a semiconductor device according to various example embodiments.

FIG. 14 illustrates a concentration distribution of Ge in a semiconductor device according to various example embodiments. FIG. 14 shows the concentration of Ge from a center of the second source/drain pattern 172 of FIG. 13 to the third subgate electrode 127Sc along an arrow direction DR. The arrow direction DR may be parallel to the first direction (x direction).

As illustrated in FIG. 13 and FIG. 14, it can be seen that the concentration of Ge is maximum or large at about 40% or more at the center of the source/drain pattern 170 (a point at a position of 0 nm), and as the distance from the center of the source/drain pattern 170 increases, the concentration of Ge decreases. The concentration of Ge is about 5% in a region between approximately 6 nm and 10 nm, which may be regarded as representing the first source/drain pattern 171. The first source/drain pattern 171 may be made of SiGe containing a low concentration of Ge, and the second source/drain pattern 172 may be made of SiGe containing a high concentration of Ge. The concentration of Ge falls to 0% in a region where the position is 10 nm or more, which may be seen as indicating the gate insulating layer 162 and the gate electrode 127.

Next, a manufacturing method of a semiconductor device according to various example embodiments will be described with reference to FIG. 15 to FIG. 23.

FIG. 15 to FIG. 23 each illustrate a process cross-sectional view sequentially illustrating a manufacturing method of a semiconductor device according to various example embodiments.

Since example embodiments illustrated in FIG. 15 to FIG. 23 is equivalent to the embodiment illustrated in FIG. 1 to FIG. 11, a description thereof will be omitted and differences therebetween will be mainly described. In addition, same reference numerals are used for same components as in previous example embodiments. Various embodiments are different from other embodiments in that a portion of the subgate dummy pattern is left without removing all of subgate dummy pattern.

Figure 15:
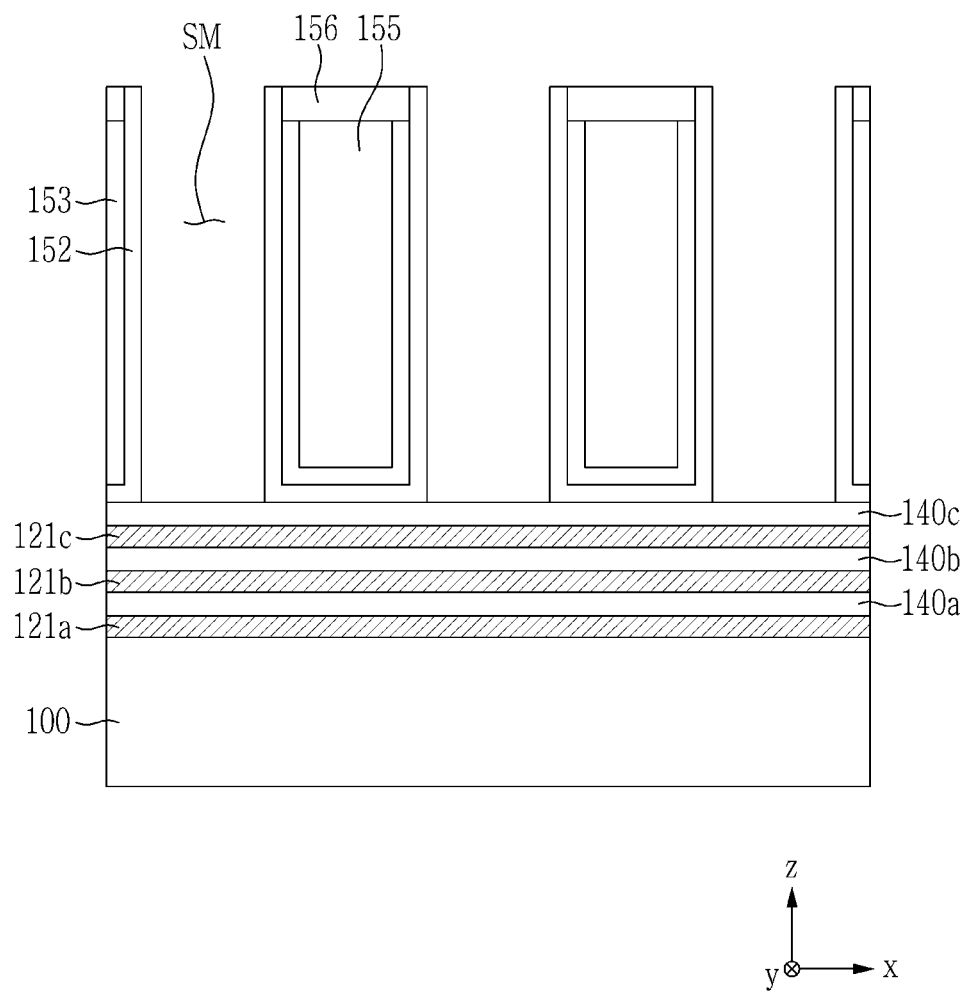
FIG. 15 to FIG. 23 each illustrate a process cross-sectional view sequentially illustrating a manufacturing method of a semiconductor device according to various example embodiments.

As illustrated in FIG. 15, a stacked structure of the subgate sacrificial patterns 121a, 121b, and 121c and the semiconductor patterns 140a, 140b, and 140c is formed on a substrate 100. Subsequently, a main gate sacrificial pattern (not illustrated) is formed, the insulating layer 155 is formed, and then the main gate sacrificial pattern is removed to form the space SM. FIG. 15 is the same as that of FIG. 3 of other example embodiments, and a same process as that of other example embodiments may be performed up to this step.

Figure 16:
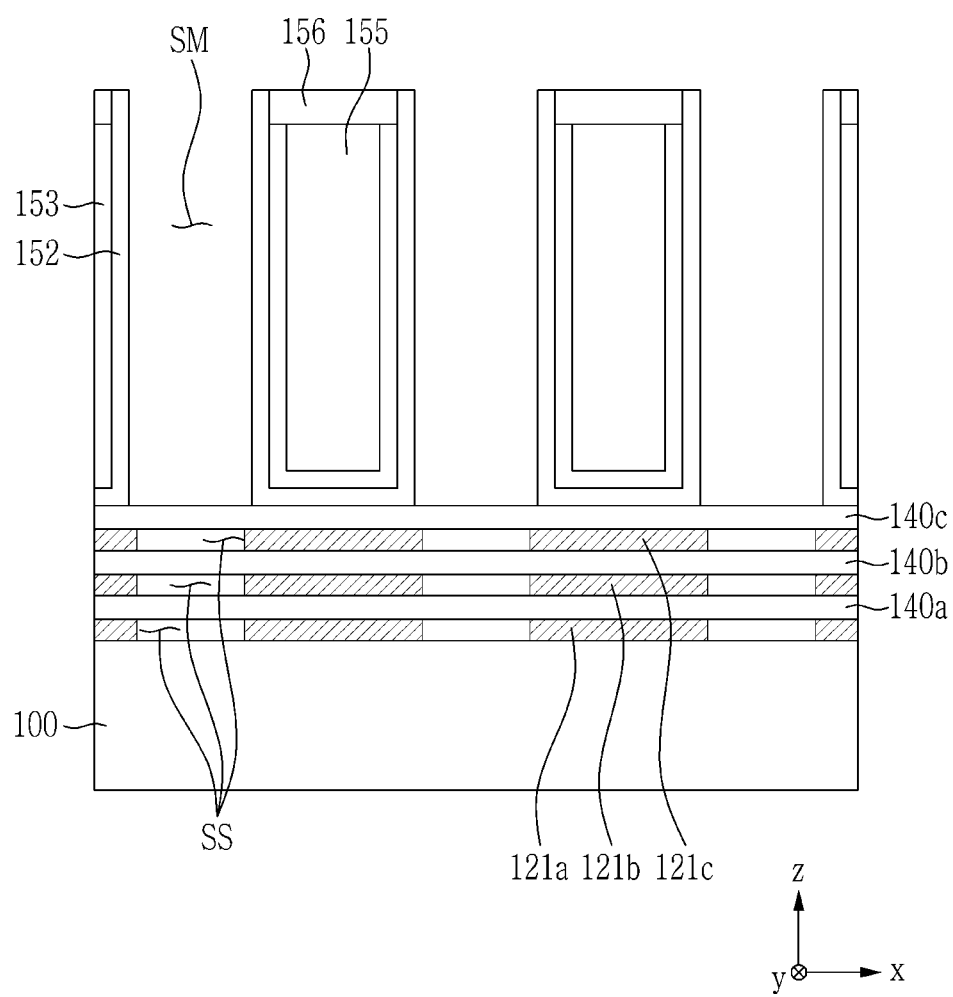

As illustrated in FIG. 16, at least a portion of the exposed subgate sacrificial patterns 121a, 121b, and 121c is removed to form the space SS. In this case, the subgate sacrificial patterns 121a, 121b, and 121c may be removed by using a wet etching process. The subgate sacrificial patterns 121a, 121b, and 121c may be sequentially removed from a portion overlapping a center of the space SM. Accordingly, by controlling etching process conditions, some regions of the subgate sacrificial patterns 121a, 121b, and 121c may be removed, and other regions may be left. For example, only partial regions of the subgate sacrificial patterns 121a, 121b, and 121c may be removed by controlling duration of the etching process. Portions of the subgate sacrificial patterns 121a, 121b, and 121c substantially overlapping the space SM in the third direction (Z direction) may be removed, while portions of the subgate sacrificial patterns 121a, 121b, and 121c overlapping the insulating layer 155 in the third direction (Z direction) may remain. A portion of the subgate sacrificial patterns 121a, 121b, and 121c overlapping a boundary between the space SM and the insulating layer 155 and its periphery in the third direction (Z direction) may remain.

Figure 17:
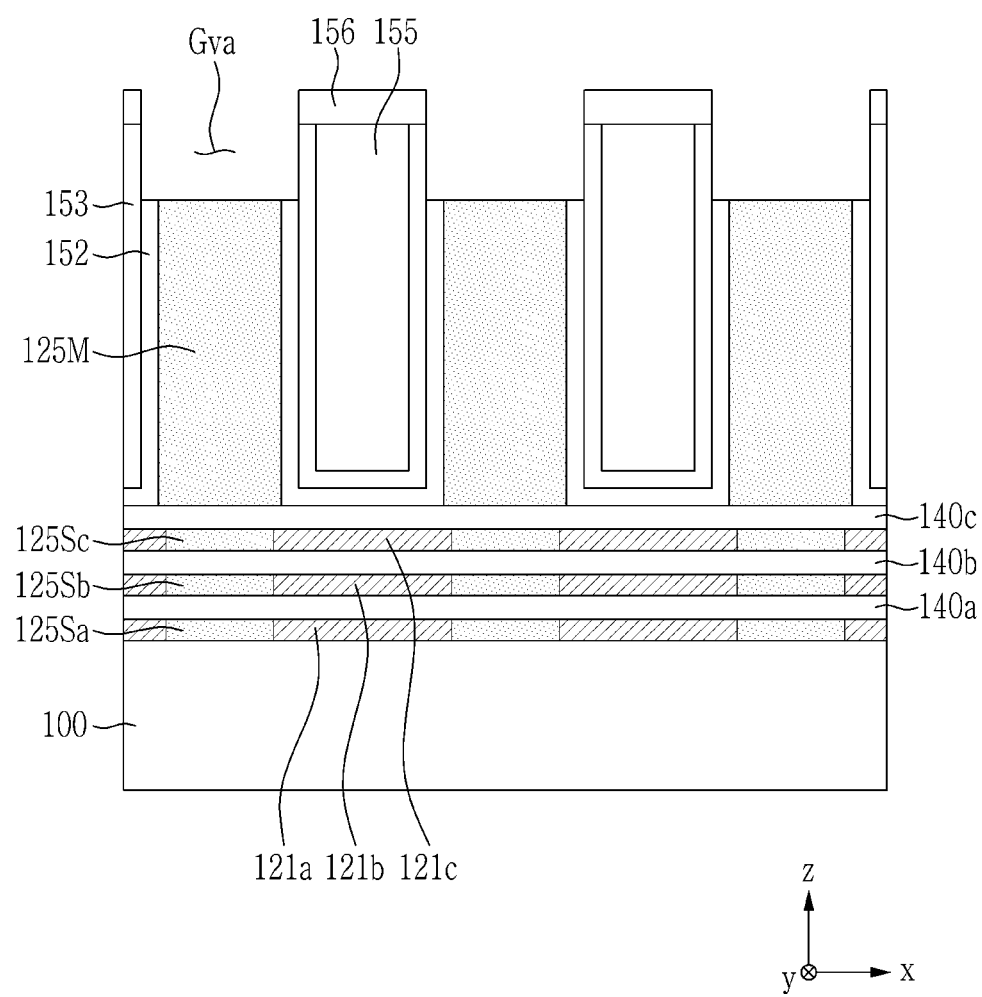

As illustrated in FIG. 17, a plurality of subgate dummy patterns 125Sa, 125Sb, and 125Sc and a main gate dummy pattern 125M are formed in spaces SM and SS formed by etching.

The subgate dummy patterns 125Sa, 125Sb, and 125Sc are positioned in the space SS from which the subgate sacrificial patterns 121a, 121b, and 121c are removed. In various other example embodiments, each of the subgate dummy patterns 125Sa, 125Sb, and 125Sc may be formed as a single pattern extending along the first direction (X direction), while in other example embodiments, each of the subgate dummy patterns 125Sa, 125Sb, and 125Sc may be formed as a plurality of separate patterns. The first gate sacrificial pattern 121a may be positioned between a plurality of first subgate dummy patterns 125Sa. The first subgate dummy patterns 125Sa and the first gate sacrificial patterns 121a may be alternately positioned along the first direction (X direction). The second gate sacrificial pattern 121b may be positioned between a plurality of second subgate dummy patterns 125Sb. The second subgate dummy patterns 125Sb and the second gate sacrificial patterns 121b may be alternately positioned along the first direction (X direction). The third gate sacrificial pattern 121c may be positioned between a plurality of third subgate dummy patterns 125Sc. The third subgate dummy patterns 125Sc and the third gate sacrificial patterns 121c may be alternately positioned along the first direction (X direction).

The main gate dummy pattern 125M is positioned in the space SM from which the main gate sacrificial pattern 123 is removed.

Figure 18:
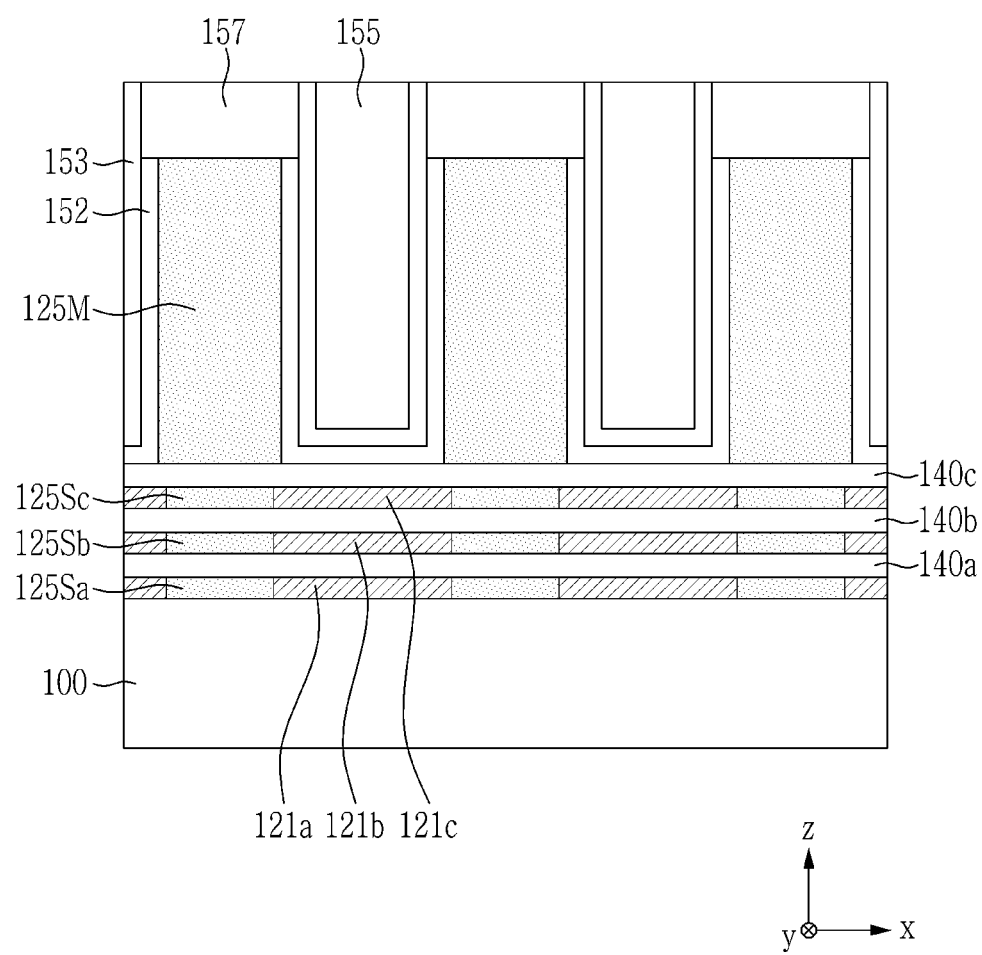

Subsequently, an upper region of the main gate dummy pattern 125M may be removed by a predetermined thickness to form the groove Gva, and as illustrated in FIG. 18, the capping layer 157 is formed in the groove Gva.

Subsequently, a polishing process is performed to remove the capping layer 156 positioned on the insulation layer 155 to expose an upper surface of the insulation layer 155.

Figure 19:
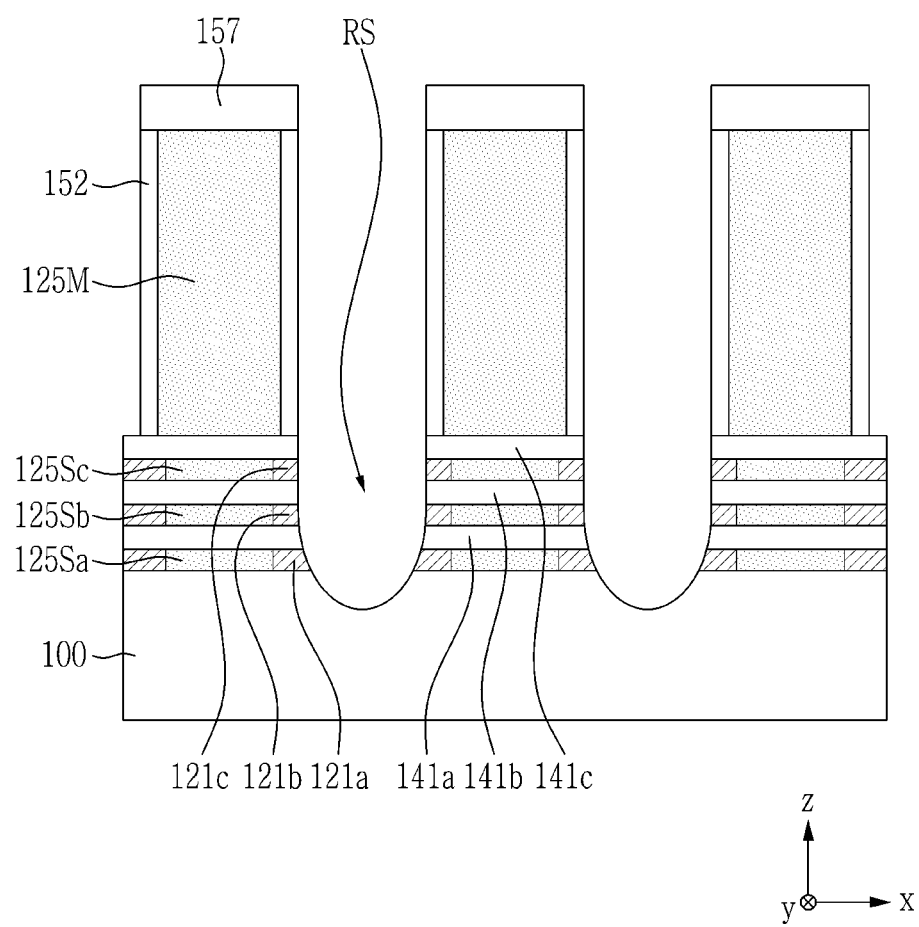

As illustrated in FIG. 19, the exposed insulating layer 155 is removed by using an etching process.

Subsequently, the semiconductor patterns 140a, 140b, and 140c and the subgate sacrificial patterns 121a, 121b, and 121c are etched to form the recess Rs. A width of the recess Rs may be narrower than that of the subgate sacrificial patterns 121a, 121b, and 121c. Accordingly, not all of the subgate sacrificial patterns 121a, 121b, and 121c may be removed, and some may remain. The third semiconductor pattern 140c, the third subgate sacrificial pattern 121c, the second semiconductor pattern 140b, the second subgate sacrificial pattern 121b, the first semiconductor pattern 140a, and the first subgate sacrificial pattern 121a may be sequentially exposed and removed. As the recess Rs is formed, side surfaces of the semiconductor patterns 140c and the subgate sacrificial patterns 121a 121b, and 121c may be exposed to the outside. In addition, an upper surface of the substrate 100 may be exposed to the outside, and the upper surface of the substrate 100 may be partially etched. In this case, the subgate dummy patterns 125Sa, 125Sb, and 125Sc may not be exposed to the outside. The subgate sacrificial patterns 121a, 121b, and 121c may be positioned between the subgate dummy patterns 125Sa, 125Sb, and 125Sc and the recess Rs.

As the recess Rs is formed, the semiconductor patterns 140a, 140b, and 140c may be separated to form a plurality of channel patterns 141a, 141b, and 141c. The channel patterns 141a, 141b, and 141c may be positioned at opposite sides of the recess Rs.

Figure 20:
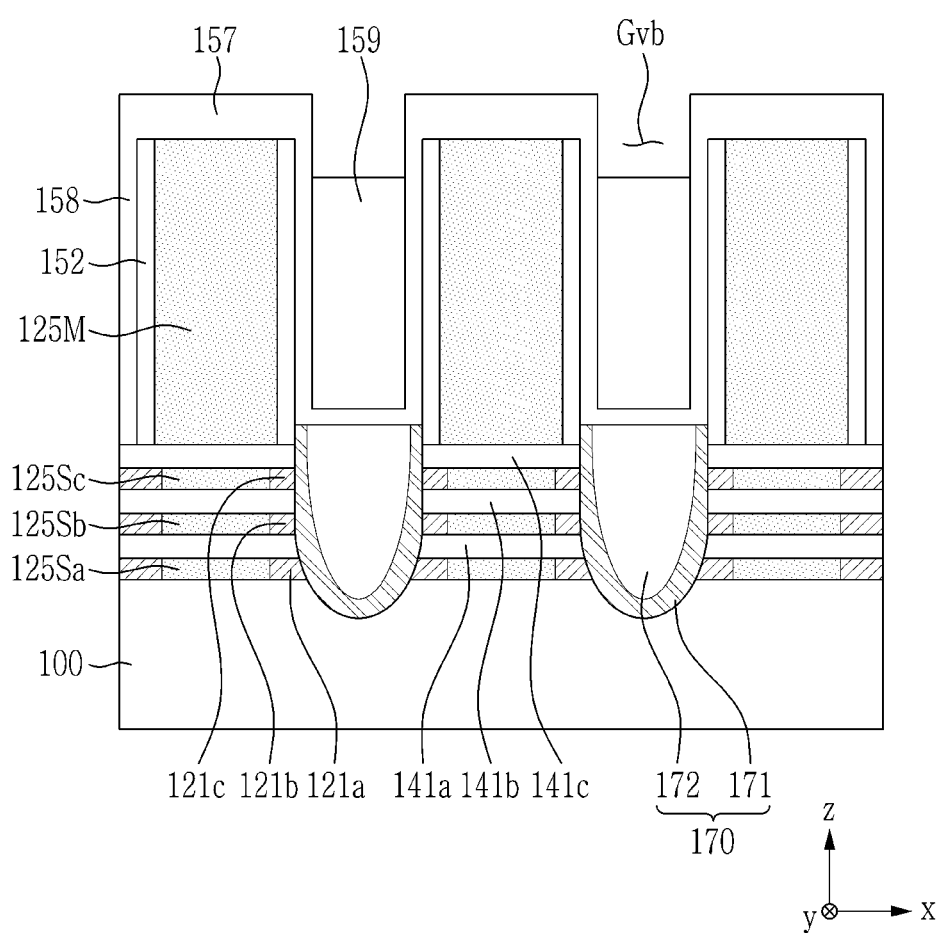

As illustrated in FIG. 20, a source/drain pattern 170 is formed in the recess Rs. The source/drain pattern 170 may be formed by using an epitaxial growth method. In this case, an inner wall of the recess Rs may be used as a seed.

In various example embodiments illustrated in FIG. 7 and FIG. 8, the inner wall of the recess Rs is formed to include the side surfaces of the channel patterns 141a, 141b, and 141c, and the subgate dummy patterns 125Sa, 125Sb, and 125Sc, and the upper surface of the substrate 100. The channel patterns 141a, 141b, and 141c and the substrate 100 may be made of Si, and although epitaxial growth may occur smoothly, the subgate dummy patterns 125Sa, 125Sb, and 125Sc are made of a silicon oxide, and thus epitaxial growth may not be performed properly or may be less likely to be performed properly.

In some example embodiments, the inner wall of the recess Rs is formed to include the side surfaces of the channel patterns 141a, 141b, and 141c, and the subgate sacrificial patterns 121a, 121b, and 121c, and the upper surface of the substrate 100. The channel patterns 141a, 141b, and 141c and the substrate 100 may be made of Si, and the subgate sacrificial patterns 121a, 121b, and 121c may be made of SiGe, and thus epitaxial growth may be more smoothly performed. Thus, the source/drain pattern 170 having a stable structure may be formed.

The source/drain pattern 170 comes into contact with the subgate sacrificial patterns 121a, 121b, and 121c, and may not come into contact with the subgate dummy patterns 125Sa, 125Sb, and 125Sc. The subgate sacrificial patterns 121a, 121b, and 121c may be positioned between the subgate dummy patterns 125Sa, 125Sb, and 125Sc and the source/drain pattern 170.

The source/drain pattern 170 may include a first source/drain pattern 171 and a second source/drain pattern 172. First, the first source/drain pattern 171 is formed in the recess Rs, the second source/drain pattern 172 may be formed on the first source/drain pattern 171. The first source/drain pattern 171 may directly contact the channel patterns 141a, 141b, and 141c, the subgate sacrificial patterns 121a, 121b, and 121c, and the substrate 100. The second source/drain pattern 172 may not directly contact the channel patterns 141a, 141b, and 141c, the subgate sacrificial patterns 121a, 121b, and 121c, and the substrate 100. The first source/drain pattern 171 may be positioned between the second source/drain pattern 172 and the channel patterns 141a, 141b, and 141c. The first source/drain pattern 171 may be positioned between the second source/drain pattern 172 and the subgate sacrificial patterns 121a, 121b, and 121c. The first source/drain pattern 171 may be positioned between the second source/drain pattern 172 and the substrate 100.

The first source/drain pattern 171 may be made of SiGe containing a low concentration of Ge, and the second source/drain pattern 172 may be made of SiGe containing a high concentration of Ge. The Ge content of the first source/drain pattern 171 may be lower than that of the second source/drain pattern 172. A difference between the Ge content of the first source/drain pattern 171 and the Ge content of the second source/drain pattern 172 may be about 20% or more. The subgate sacrificial patterns 121a, 121b, and 121c may be made of SiGe containing Ge of a medium concentration. The Ge content of the subgate sacrificial patterns 121a, 121b, and 121c may be higher than the Ge content of the first source/drain pattern 171 and lower than the Ge content of the second source/drain pattern 172. A difference between the Ge content of the first source/drain pattern 171 and the Ge content of the subgate sacrificial patterns 121a, 121b, and 121c may be about 5% or more.

Subsequently, the protective layer 158 is formed on the source/drain pattern 170, and the insulation layer 159 is formed on the protective layer 158. An upper region of the insulation layer 159 is removed by a certain thickness to form a groove Gvb.

Figure 21:
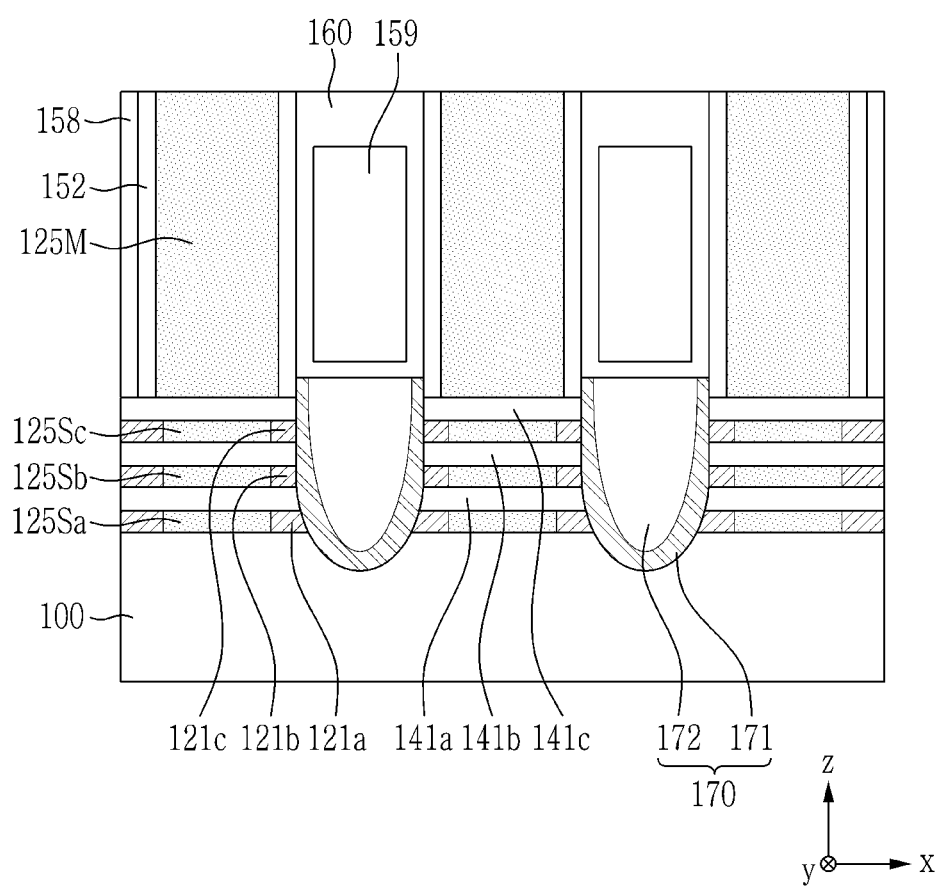

As illustrated in FIG. 21, a capping layer 160 is formed in the groove Gvb.

Subsequently, the polishing process may be performed until an upper surface of the main gate dummy pattern 125M is exposed.

Figure 22:
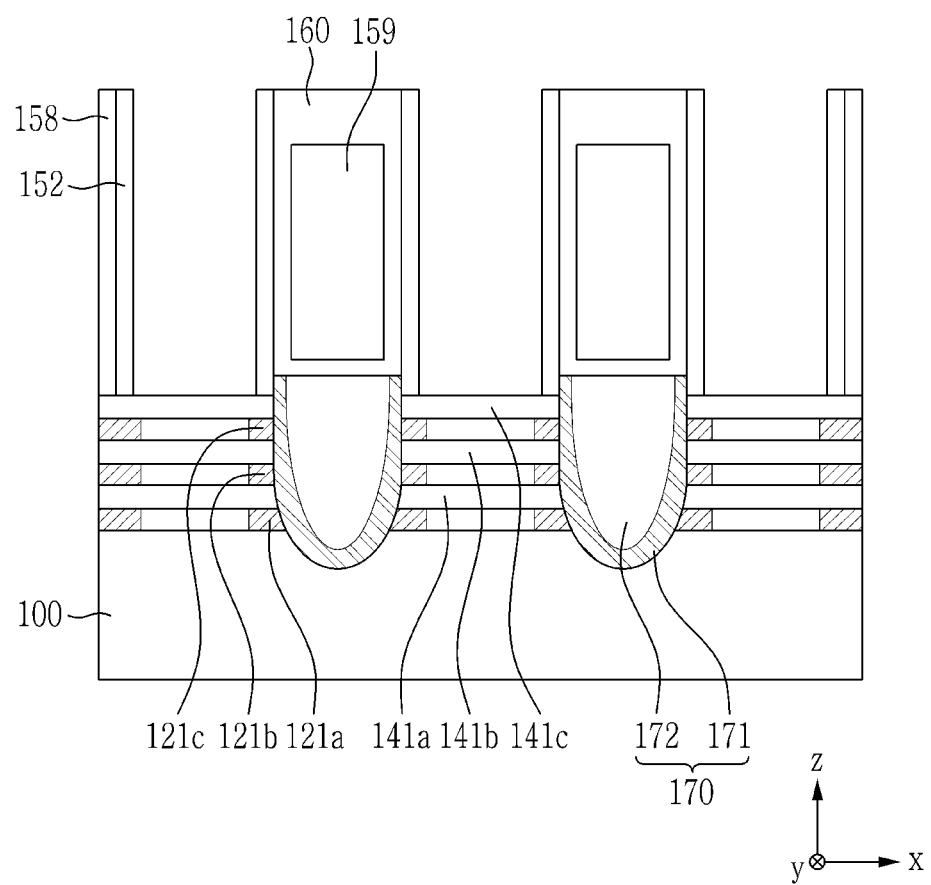

As illustrated in FIG. 22, the exposed main gate dummy pattern 125M is removed by using an etching process. While the main gate dummy pattern 125M is removed, a plurality of subgate dummy patterns 125Sa, 125Sb, and 125Sc may be exposed to the outside, and the plurality of subgate dummy patterns 125Sa, 125Sb, and 125Sc may be removed together.

The subgate dummy patterns 125Sa, 125Sb, and 125Sc and the main gate dummy pattern 125M are made of a material having a high selectivity with respect to the channel patterns 141a, 141b, and 141c and the subgate sacrificial patterns 121a, 121b, and 121c. For example, the subgate dummy patterns 125Sa, 125Sb, and 125Sc and the main gate dummy pattern 125M may be made of a silicon oxide, the channel patterns 141a, 141b, and 141c may be made of Si, and the and the subgate sacrificial patterns 121a, 121b, and 121c may be made of SiGe. The etching process may be performed by using an etchant having a relatively high etching rate for the silicon oxide. Accordingly, the main gate dummy pattern 125M and the subgate dummy patterns 125Sa, 125Sb, and 125Sc are removed, and the channel patterns 141a, 141b, and 141c and the and the subgate sacrificial patterns 121a, 121b, and 121c remain. In this case, the source/drain pattern 170 may be covered by the channel patterns 141a, 141b, and 141c and the subgate sacrificial patterns 121a, 121b, and 121c, and may not be exposed to the outside. First side surfaces of the sub-gate sacrificial patterns 121a, 121b, and 121c may be in contact with the source/drain pattern 170, and second side surfaces thereof may be exposed to the outside.

Figure 23:
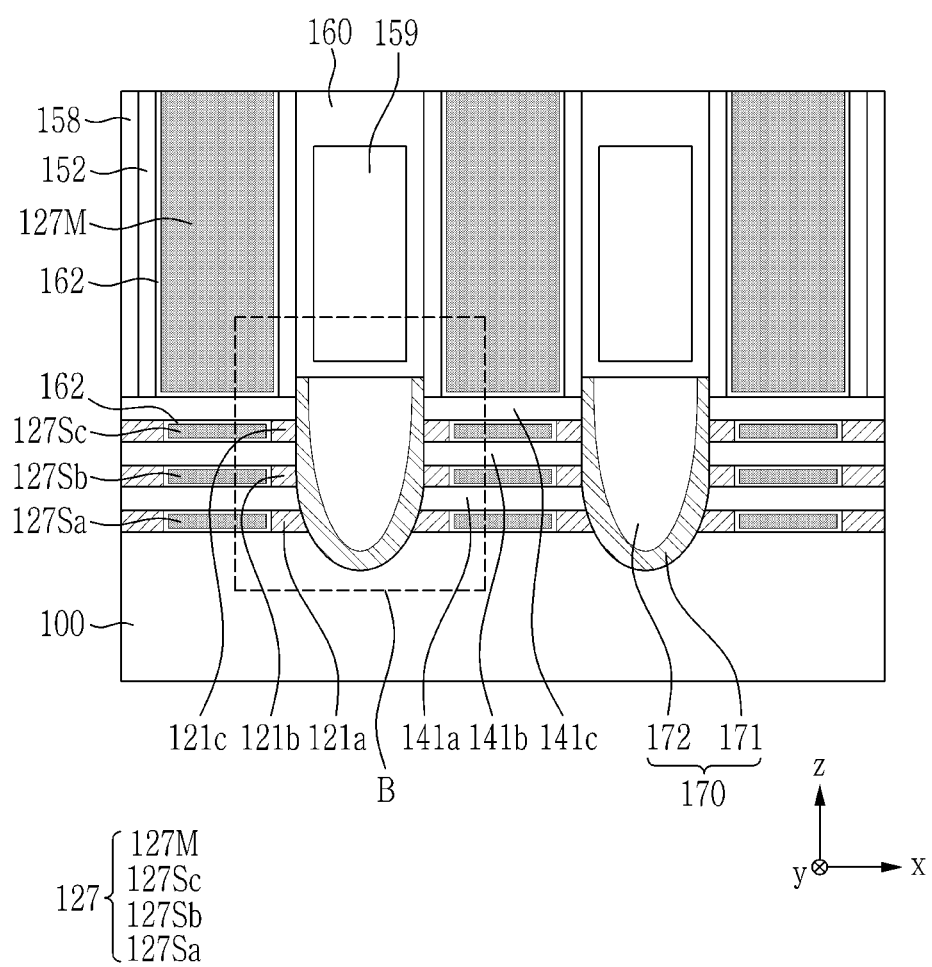

As illustrated in FIG. 23, a gate insulating layer 162 is formed in a space where the main gate dummy pattern 125M and the subgate dummy patterns 125Sa, 125Sb, and 125Sc are removed, and a gate electrode 127 is formed on the gate insulating layer 162. The gate electrode 127 may include a plurality of subgate electrodes 127Sa, 127Sb, and 127Sc and a main gate electrode 127M.

The subgate electrodes 127Sa, 127Sb, and 127Sc are positioned in a space where the subgate dummy patterns 125Sa, 125Sb, and 125Sc are removed. The gate insulating layer 162 and the subgate sacrificial patterns 121a, 121b, and 121c may be positioned between subgate electrodes 127Sa, 127Sb, and 127Sc and the source/drain pattern 170.

The main gate electrode 127M is positioned in a space where the main gate dummy pattern 125M is removed. The main gate electrode 127M is positioned on the gate insulating layer 162, and is formed to fill a space.

In a manufacturing method of a semiconductor device according to various example embodiments, before the source/drain pattern 170 is formed, the main gate dummy pattern 125M and the subgate dummy patterns 125Sa, 125Sb, and 125Sc made of a silicon oxide may be formed to replace the main gate sacrificial pattern 123 made of SiGe and the subgate sacrificial patterns 121a, 121b, 121c, thereby preventing damage to the source/drain pattern 170.

Next, a semiconductor device according to various example embodiments will be described with reference to FIG. 24 along with FIG. 23.

Figure 24:
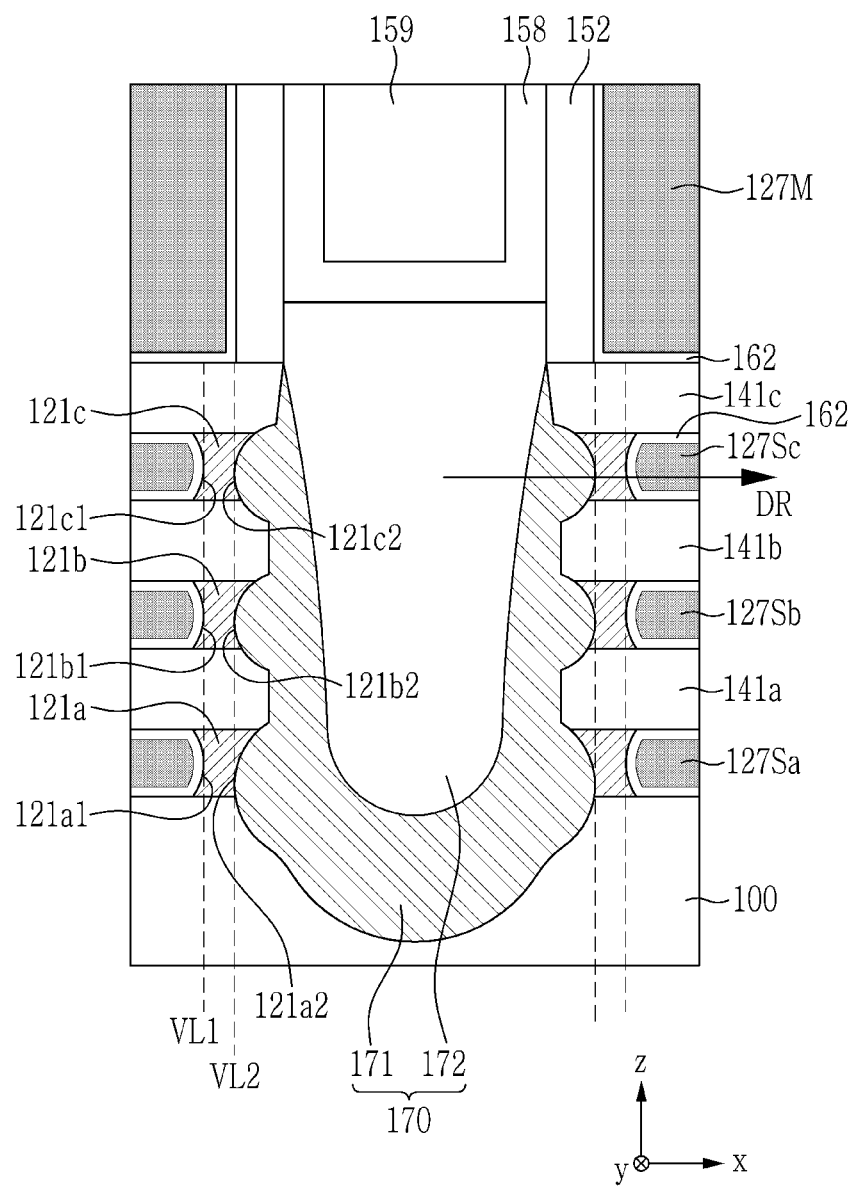
FIG. 24 illustrates an enlarged view of a region B of FIG. 23.

FIG. 24 illustrates an enlarged view of a region B of FIG. 23.

As illustrated in FIG. 23 and FIG. 24, according to various example embodiments, a semiconductor device includes a substrate 100, a plurality of channel patterns 141a, 141b, and 141c stacked apart from each other on the substrate 100, a gate electrode 127 surrounding the channel patterns 141a, 141b, and 141c, a gate insulating layer 162 positioned between the channel patterns 141a, 141b, and 141c and a plurality of subgate sacrificial patterns 121a, 121b, and 121c positioned between the gate electrode 127 and the source/drain pattern 170.

In various example embodiments illustrated in FIG. 11 to FIG. 13, the source/drain pattern 170 may contact the gate insulating layer 162, while in other example embodiments, the source/drain pattern 170 may not contact the gate insulating layer 162. The subgate sacrificial patterns 121a, 121b, and 121c may be positioned between the source/drain pattern 170 and the gate insulating layer 162. First side surfaces 121a1, 121b1, and 121c1 of the subgate sacrificial patterns 121a, 121b, and 121c contacting the gate insulating layer 162 may have a concave shape in a cross-sectional view. The first side surfaces 121a1, 121b1, and 121c1 of the subgate sacrificial patterns 121a, 121b, and 121c may be aligned side by side along a first imaginary line VL1 extending in a direction that is parallel to the third direction (z direction). Second side surfaces 121a2, 121b2, and 121c2 of the subgate sacrificial patterns 121a, 121b, and 121c contacting the source/drain pattern 170 may have a concave shape in a cross-sectional view. The second side surfaces 121a2, 121b2, and 121c2 of the subgate sacrificial patterns 121a, 121b, and 121c may be aligned side by side along a second imaginary line VL2 extending in a direction that is parallel to the third direction (z direction). A width between the first imaginary line VL1 and the second imaginary line VL2 may be constant. Accordingly, a minimum width of the subgate sacrificial patterns 121a, 121b, and 121c in the first direction (X direction) may be constant.

The subgate sacrificial patterns 121a, 121b, and 121c and the source/drain pattern 170 may include SiGe. The Ge content of the subgate sacrificial patterns 121a, 121b, and 121c, the Ge content of the first source/drain pattern 171, and the Ge content of the second source/drain pattern 172 may be different. The subgate sacrificial patterns 121a, 121b, and 121c may be made of SiGe containing a medium concentration of Ge, the first source/drain pattern 171 may be made of SiGe containing a low concentration of Ge, and the second source/drain pattern 172 may be made of SiGe containing a high concentration of Ge. However, materials of the subgate sacrificial patterns 121a, 121b, and 121c and the source/drain pattern 170 are not limited thereto, and may be variously changed.

Hereinafter, the concentration distribution of Ge from the center of the source/drain pattern 170 along the first direction (X direction) will be described as follows with further reference to FIG. 25.

Figure 25:
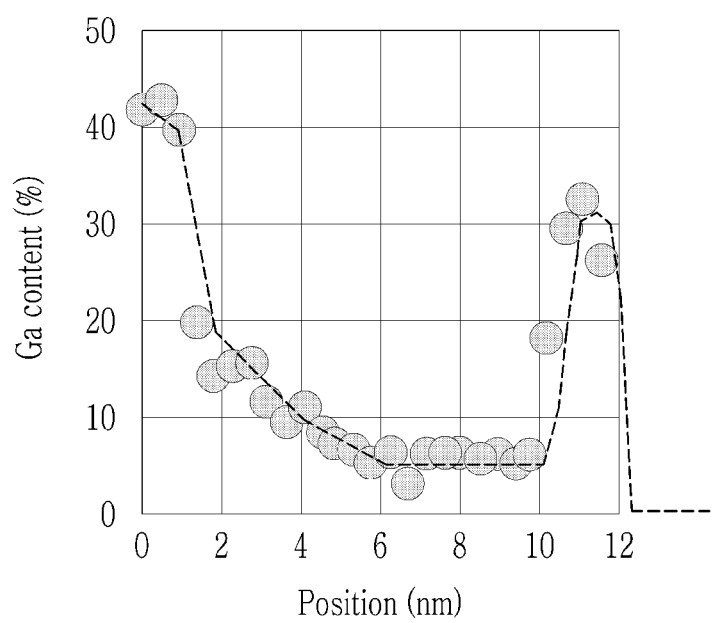
FIG. 25 illustrates a concentration distribution of Ge in a semiconductor device according to various example embodiments.

FIG. 25 illustrates a concentration distribution of Ge in a semiconductor device according to various example embodiments. FIG. 25 shows the concentration of Ge from a center of the second source/drain pattern 172 of FIG. 24 to the third subgate electrode 127Sc along an arrow direction DR. The arrow direction DR may be parallel to the first direction (X direction).

As illustrated in FIG. 24 and FIG. 25, it can be seen that the concentration of Ge is maximum or large at about 40% or more at the center of the source/drain pattern 170 (a point at a position of 0 nm), and as the distance from the center of the source/drain pattern 170 increases, the concentration of Ge decreases, then increases again, then decreases. The concentration of Ge is about 5% in a region between approximately 6 nm and 10 nm, which may be regarded as representing the first source/drain pattern 171. The first source/drain pattern 171 may be made of SiGe containing a low concentration of Ge, and the second source/drain pattern 172 may be made of SiGe containing a high concentration of Ge. In a region between 10 nm and 12 nm, there is a portion where the concentration of Ge increases to about 30%, which may be seen as representing the subgate sacrificial patterns 121a, 121b, and 121c. The concentration of Ge falls to 0% in a region where the position is 12 nm or more, which may be seen as indicating the gate insulating layer 162 and the gate electrode 127.

Next, a manufacturing method of a semiconductor device according to various modifications will be described with reference to FIG. 26 to FIG. 32.

FIG. 26 to FIG. 32 each illustrate a cross-sectional view showing a semiconductor device according to various example embodiments.

As illustrated in FIG. 26 to FIG. 32, according to various example embodiments, a semiconductor device includes a substrate 100, a plurality of channel patterns 141a, 141b, and 141c stacked apart from each other on the substrate 100, a gate electrode 127 surrounding the channel patterns 141a, 141b, and 141c, a gate insulating layer 162 positioned between the channel patterns 141a, 141b, and 141c and a plurality of subgate sacrificial patterns 121a, 121b, and 121c positioned between the gate electrode 127 and the source/drain pattern 170.

Figure 26:
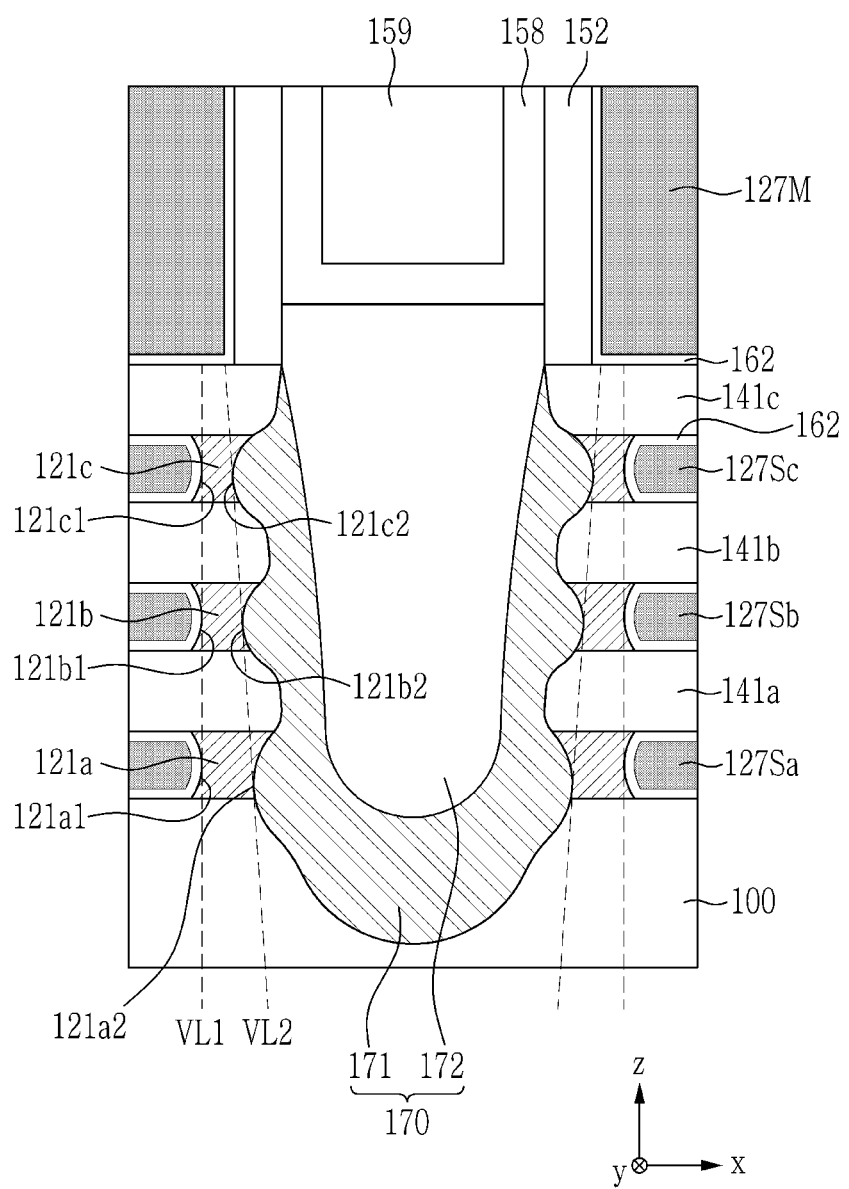
FIG. 26 to FIG. 32 each illustrate a cross-sectional view showing a semiconductor device according to various example embodiments.

In various example embodiments illustrated in FIG. 26, first side surfaces 121a1, 121b1, and 121c1 of the subgate sacrificial patterns 121a, 121b, and 121c contacting the gate insulating layer 162 may have a concave shape in a cross-sectional view. The first side surfaces 121a1, 121b1, and 121c1 of the subgate sacrificial patterns 121a, 121b, and 121c may be aligned side by side along a first imaginary line VL1 extending in a direction that is parallel to the third direction (z direction). Second side surfaces 121a2, 121b2, and 121c2 of the subgate sacrificial patterns 121a, 121b, and 121c contacting the source/drain pattern 170 may have a concave shape in a cross-sectional view. The second side surfaces 121a2, 121b2, and 121c2 of the subgate sacrificial patterns 121a, 121b, and 121c may be aligned side by side along a second imaginary line VL2 extending in a direction that is oblique to the third direction (z direction). A width between the first imaginary line VL1 and the second imaginary line VL2 may gradually decrease as the distance from the substrate 100 increases. Accordingly, a minimum width of the subgate sacrificial patterns 121a, 121b, and 121c in the first direction (X direction) may be reduced in an order of the first subgate sacrificial pattern 121a, the second subgate sacrificial pattern 121b, and the third subgate sacrificial pattern 121c. This may be because the third subgate sacrificial pattern 121a exposed first in the process of forming the recess Rs may be etched relatively more than remaining portions.

Figure 27:
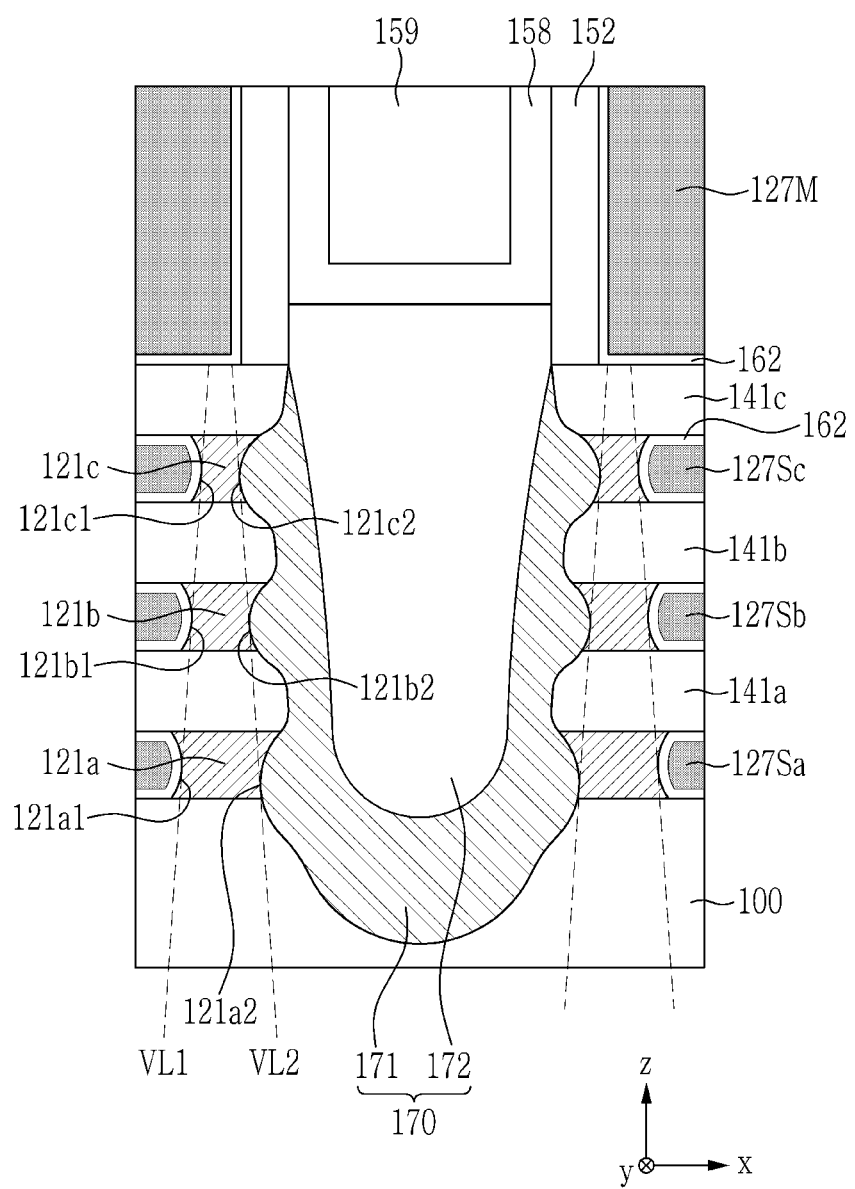

In various example embodiments illustrated in FIG. 27, first side surfaces 121a1, 121b1, and 121c1 of the subgate sacrificial patterns 121a, 121b, and 121c contacting the gate insulating layer 162 may have a concave shape in a cross-sectional view. The first side surfaces 121a1, 121b1, and 121c1 of the subgate sacrificial patterns 121a, 121b, and 121c may be aligned side by side along a first imaginary line VL1 extending in a direction that is oblique to the third direction (z direction). Second side surfaces 121a2, 121b2, and 121c2 of the subgate sacrificial patterns 121a, 121b, and 121c contacting the source/drain pattern 170 may have a concave shape in a cross-sectional view. The second side surfaces 121a2, 121b2, and 121c2 of the subgate sacrificial patterns 121a, 121b, and 121c may be aligned side by side along a second imaginary line VL2 extending in a direction that is oblique to the third direction (z direction). The first imaginary line VL1 and the second imaginary line VL2 may extend in different directions. A width between the first imaginary line VL1 and the second imaginary line VL2 may gradually decrease as the distance from the substrate 100 increases. Accordingly, a minimum or small width of the subgate sacrificial patterns 121a, 121b, and 121c in the first direction (X direction) may be reduced in an order of the first subgate sacrificial pattern 121a, the second subgate sacrificial pattern 121b, and the third subgate sacrificial pattern 121c. This is because the third sub-gate sacrificial pattern 121a exposed first in the process of forming the space SS by removing at least a portion of the subgate sacrificial patterns 121a, 121b, and 121c and the process of forming the recess Rs may be etched relatively more than remaining portions.

Figure 28:
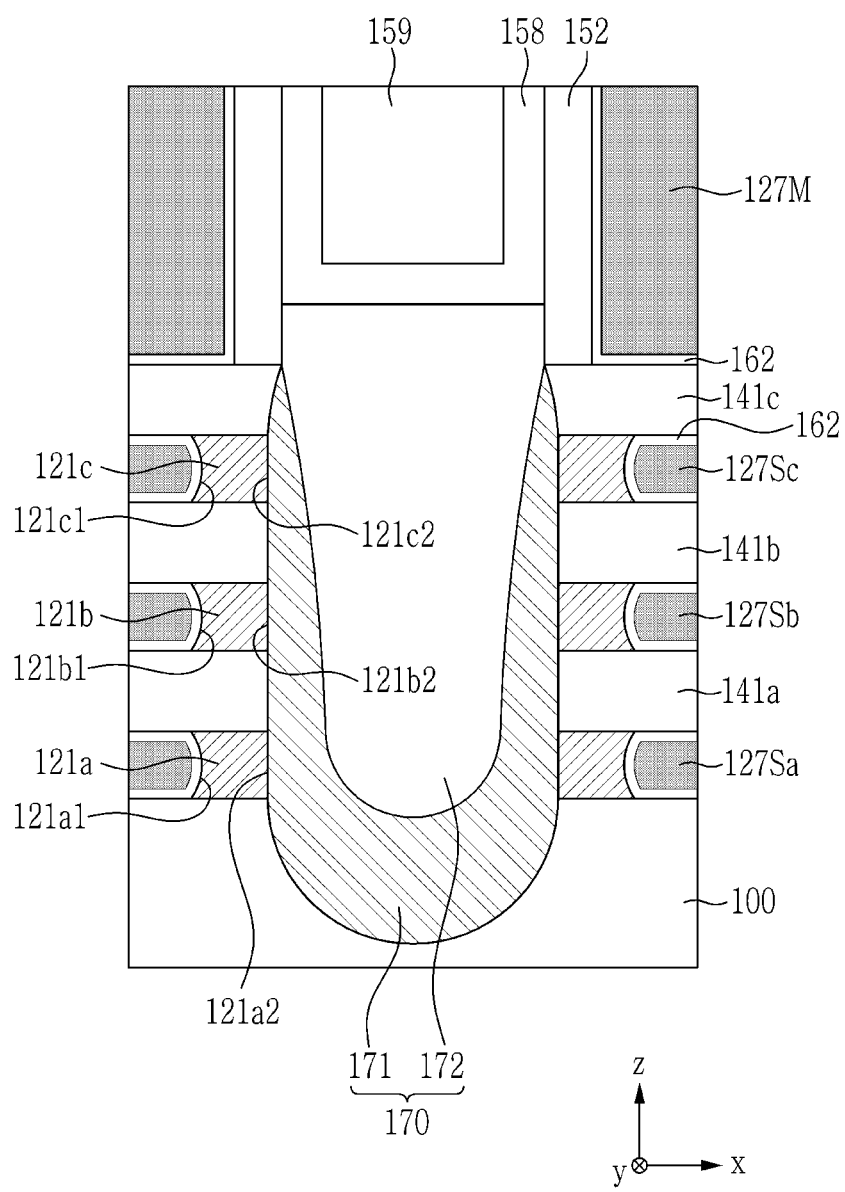

In various embodiments illustrated in FIG. 28, first side surfaces 121a1, 121b1, and 121c1 of the subgate sacrificial patterns 121a, 121b, and 121c contacting the gate insulating layer 162 may have a concave shape in a cross-sectional view. Second side surfaces 121a2, 121b2, and 121c2 of the subgate sacrificial patterns 121a, 121b, and 121c contacting the source/drain pattern 170 may have a flat shape in a cross-sectional view.

Figure 29:
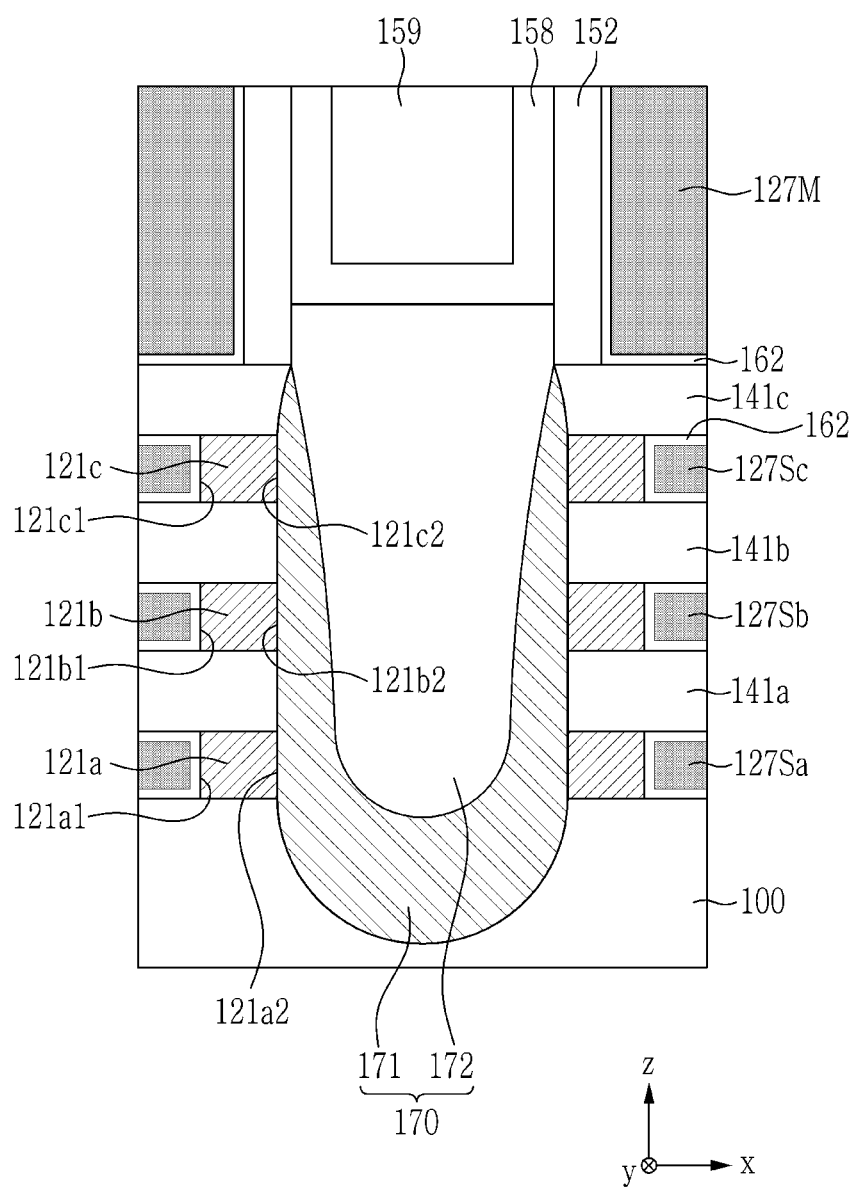

In various embodiments illustrated in FIG. 29, first side surfaces 121a1, 121b1, and 121c1 of the subgate sacrificial patterns 121a, 121b, and 121c contacting the gate insulating layer 162 may have a flat shape in a cross-sectional view. Second side surfaces 121a2, 121b2, and 121c2 of the subgate sacrificial patterns 121a, 121b, and 121c contacting the source/drain pattern 170 may have a flat shape in a cross-sectional view.

Figure 30:
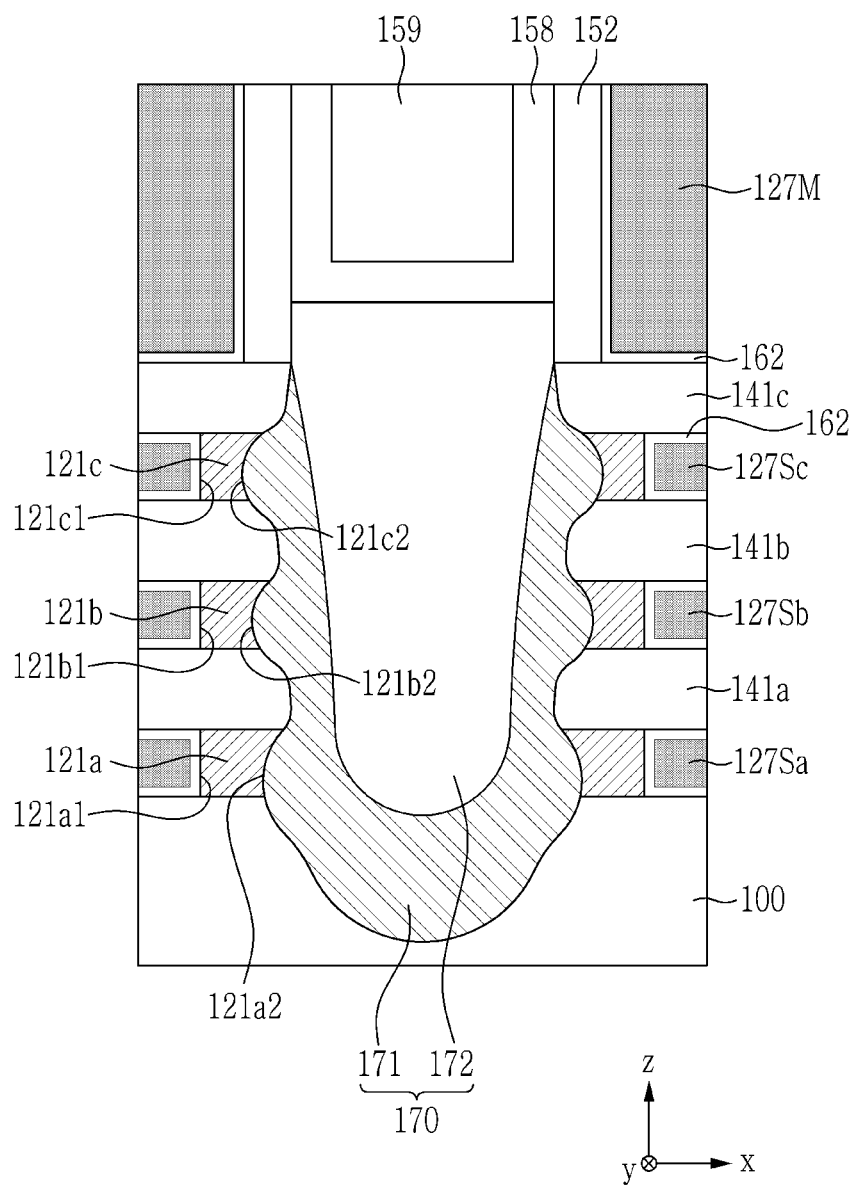

In various embodiments illustrated in FIG. 30, first side surfaces 121a1, 121b1, and 121c1 of the subgate sacrificial patterns 121a, 121b, and 121c contacting the gate insulating layer 162 may have a flat shape in a cross-sectional view. Second side surfaces 121a2, 121b2, and 121c2 of the subgate sacrificial patterns 121a, 121b, and 121c contacting the source/drain pattern 170 may have a concave shape in a cross-sectional view.

Figure 31:
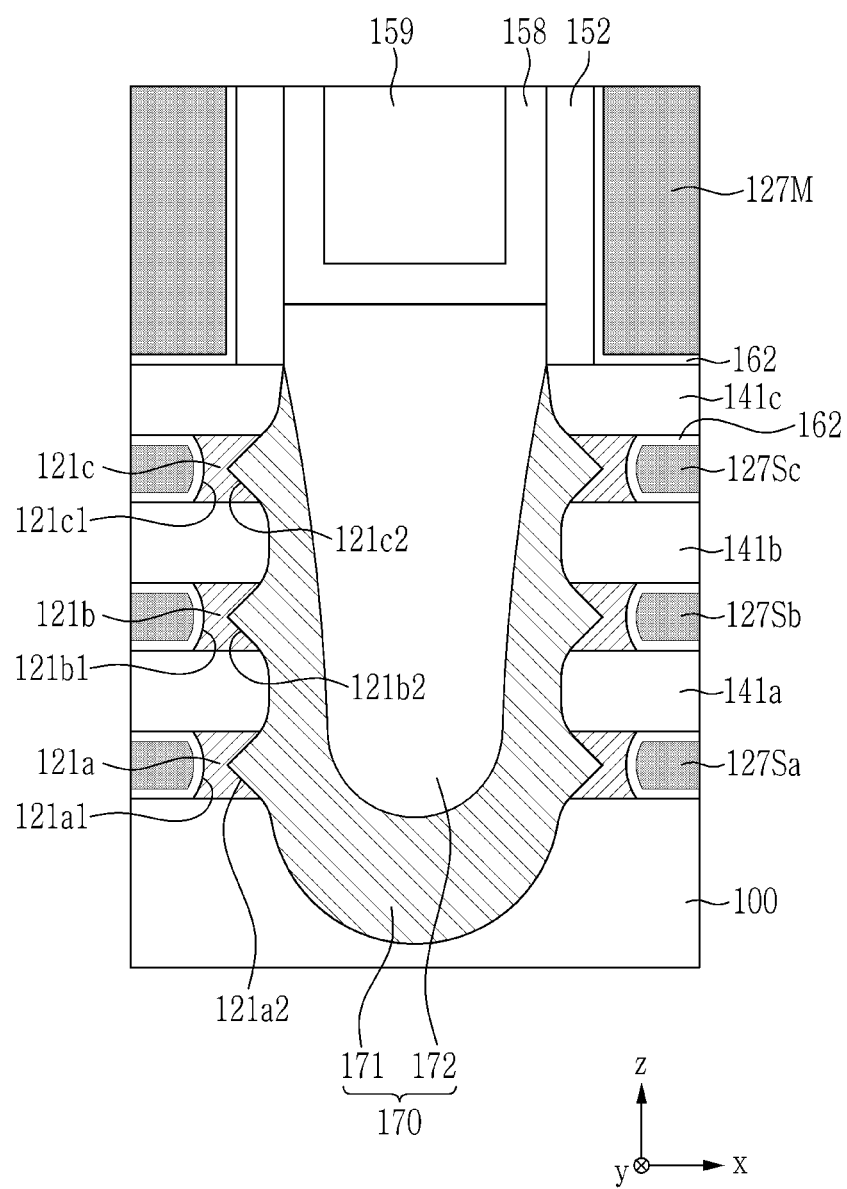

In various embodiments illustrated in FIG. 31, first side surfaces 121a1, 121b1, and 121c1 of the subgate sacrificial patterns 121a, 121b, and 121c contacting the gate insulating layer 162 may have a concave shape in a cross-sectional view. Second side surfaces 121a2, 121b2, and 121c2 of the subgate sacrificial patterns 121a, 121b, and 121c contacting the source/drain pattern 170 may have a concave shape in a cross-sectional view. In this case, concave shapes of the second side surfaces 121a2, 121b2, and 121c2 may be formed in an angular shape.

In a manufacturing method of a semiconductor device according to various example embodiments, after forming the recess Rs, a process of selectively etching the subgate sacrificial patterns 121a, 121b, and 121c may be further performed, thereby forming the recess Rs to have a bumpy shape. Accordingly, second side surfaces 121a2, 121b2, and 121c2 of the subgate sacrificial patterns 121a, 121b, and 121c may have a concave shape in a cross-sectional view. When a dry etching or plasma etching is used in the process of selectively etching the subgate sacrificial patterns 121a, 121b, and 121c, the concave shapes of the second side surfaces 121a2, 121b2, and 121c2 may be rounded. Alternatively or additionally, when a wet etching method is used in the process of selectively etching the subgate sacrificial patterns 121a, 121b, and 121c, the concave shapes of the second side surfaces 121a2, 121b2, and 121c2 may be formed in an angular shape.

Figure 32:
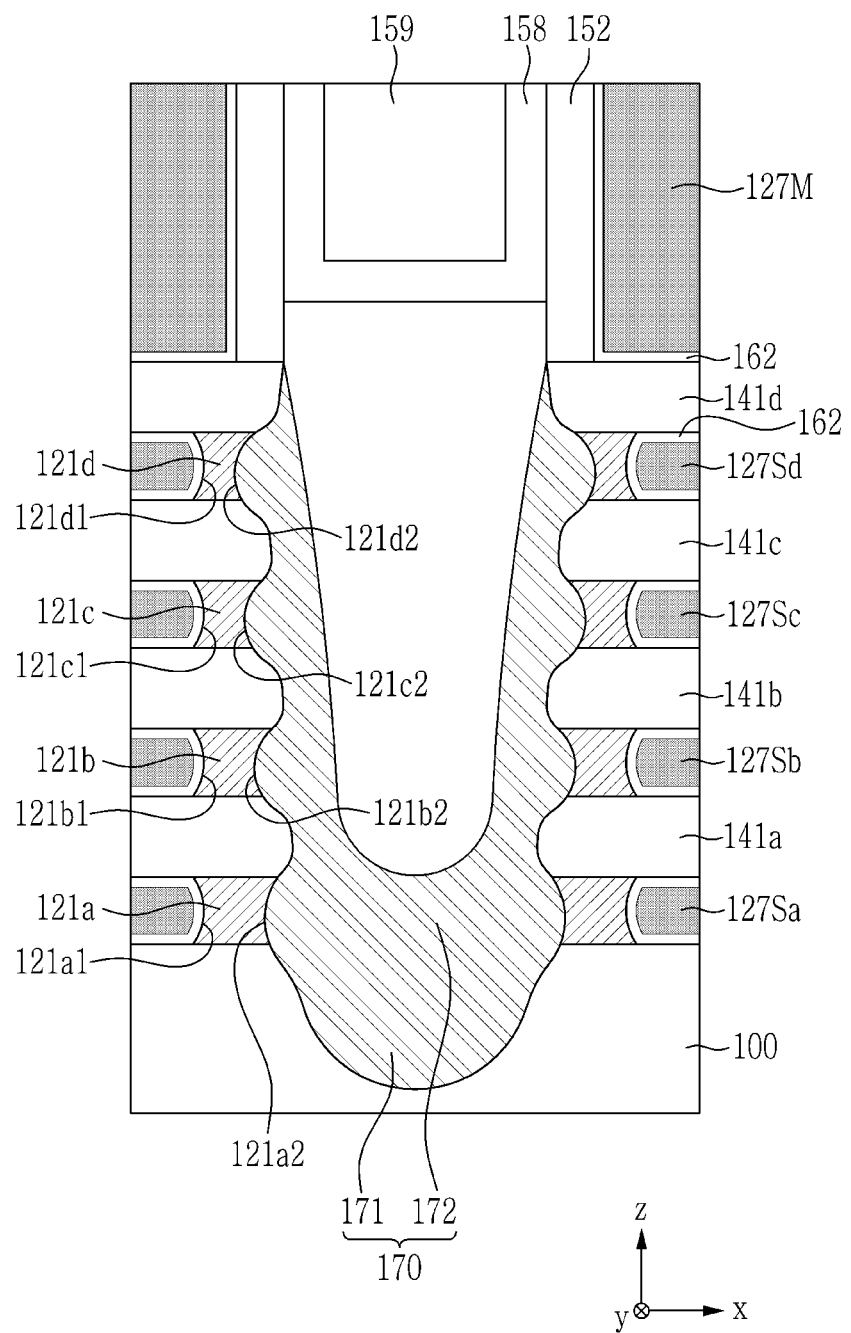

In some example embodiments illustrated in FIG. 32, the subgate sacrificial patterns 121a, 121b, 121c, and 121d may include a first subgate sacrificial pattern 121a, a second subgate sacrificial pattern 121b, and a third subgate sacrificial pattern. 121c, and a fourth subgate sacrificial pattern 121d. The channel patterns 141a, 141b, 141c, and 141d may include a first channel pattern 141a, a second channel pattern 141b, a third channel pattern 141c, and a fourth channel pattern 141d. The subgate electrodes 127Sa, 127Sb, 127Sc, and 127Sd may include a first subgate electrode 127Sa, a second subgate electrode 127Sb, a third subgate electrode 127Sc, and a fourth subgate electrode 127Sd.

This may be implemented by adjusting a number of layers of each component in a process of forming the subgate sacrificial patterns 121a, 121b, 121c, and 121d and the semiconductor patterns by alternately stacking them. For example, a structure of FIG. 32 may be implemented by alternately stacking four subgate sacrificial patterns 121a, 121b, 121c, and 121d and four semiconductor patterns. However, a number of subgate sacrificial patterns 121a, 121b, 121c, and 121d, a number of channel patterns 141a, 141b, 141c, and 141d, and a number of subgate electrodes 127Sa, 127Sb, 127Sc, and 127Sd are not limited thereto, and may be variously changed.

In FIG. 28, FIG. 29, and FIG. 31, although an alignment direction of the first side surfaces 121a1, 121b1, and 121c1 of the subgate sacrificial patterns 121a, 121b, and 121c is parallel to an alignment direction of the second side surfaces 121a2, 121b2, and 121c2, but example embodiments are not limited thereto. As in the previous embodiment, the alignment direction of the first side surfaces 121a1, 121b1, and 121c1 may be different from the alignment direction of the second side surfaces 121a2, 121b2, and 121c2. In addition, it is shown that a minimum width of the subgate sacrificial patterns 121a, 121b, and 121c in the first direction (X direction) is constant, but example embodiments are not limited thereto. Similar to the previous embodiments, the subgate sacrificial patterns 121a, 121b, and 121c may have different minimum widths in the first direction (X direction).

In FIG. 30 and FIG. 32, although the alignment direction of the first side surfaces 121a1, 121b1, and 121c1 of the subgate sacrificial patterns 121a, 121b, and 121c is different from the alignment direction of the second side surfaces 121a2, 121b2, and 121c2, but example embodiments are not limited thereto. The alignment direction of the first side surfaces 121a1, 121b1, and 121c1 of the subgate sacrificial patterns 121a, 121b, and 121c may be aligned with the alignment direction of the second side surfaces 121a2, 121b2, and 121c2. In addition, it is shown that minimum widths of the subgate sacrificial patterns 121a, 121b, and 121c in the first direction (X direction) are different, but example embodiments are not limited thereto. The minimum width of the subgate sacrificial patterns 121a, 121b, and 121c in the first direction (X direction) may be constant.

While various example embodiments have been described, it is to be understood that example embodiments are not limited to the described examples, but, on the contrary, is intended to cover various modifications and equivalent arrangements included within the spirit and scope of the appended claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A manufacturing method of a semiconductor device, the method comprising:
    alternately stacking a plurality of subgate sacrificial patterns and a plurality of semiconductor patterns on a substrate;
    forming a plurality of main gate sacrificial patterns spaced apart from each other on a stacked structure of the subgate sacrificial patterns and the semiconductor patterns;
    forming a first insulating layer between the main gate sacrificial patterns;
    removing the main gate sacrificial patterns;
    removing the subgate sacrificial patterns;
    forming a main gate dummy pattern in a space from which the main gate sacrificial patterns are removed;
    forming a plurality of subgate dummy patterns in a space from which the subgate sacrificial patterns are removed;
    removing the first insulating layer;
    forming a recess under a space where the first insulating layer is removed;
    forming a source/drain pattern within the recess;
    forming a second insulating layer on the source/drain pattern;
    removing the main gate dummy pattern and the subgate dummy patterns; and
    forming a gate electrode in a space where the main gate dummy pattern and the subgate dummy patterns are removed.

2. The manufacturing method of claim 1, wherein
    the subgate sacrificial patterns are formed of SiGe,
    the semiconductor patterns are formed of Si,
    the source/drain pattern is formed of SiGe, and
    the subgate dummy patterns are formed of a different material from that of the source/drain pattern.

3. The manufacturing method of claim 2, further comprising, in the forming of the recess, removing a portion of the semiconductor patterns positioned below the space from which the first insulating layer was removed, and removing a portion of the subgate dummy patterns positioned below the space where the first insulating layer is removed.

4. The manufacturing method of claim 3, wherein
in the removing of the subgate sacrificial patterns,
all of the subgate sacrificial patterns are removed.

5. The manufacturing method of claim 3, wherein
in the forming of the source/drain pattern,
the source/drain pattern is in contact with the subgate dummy patterns.

6. The manufacturing method of claim 3, wherein
the forming of the source/drain pattern includes:
forming a first source/drain pattern within the recess; and
forming a second source/drain pattern on the first source/drain pattern, wherein
a Ge content of the first source/drain pattern is lower than a Ge content of the second source/drain pattern.

7. The manufacturing method of claim 2, wherein
in the forming of the recess, a portion of the semiconductor patterns positioned below the space from which the first insulating layer was removed is removed, and
a portion of the subgate sacrificial patterns positioned below the space where the first insulating layer is removed is removed.

8. The manufacturing method of claim 7, wherein
in the removing of the subgate sacrificial patterns,
some regions of the subgate sacrificial patterns are removed and other regions are left.

9. The manufacturing method of claim 7, wherein
the subgate sacrificial patterns are positioned between the gate electrode and the source/drain pattern.

10. The manufacturing method of claim 7, wherein
in the forming of the source/drain pattern,
the source/drain pattern is in contact with the subgate sacrificial patterns.

11. The manufacturing method of claim 7, wherein
the forming of the source/drain pattern includes:
forming a first source/drain pattern within the recess; and
forming a second source/drain pattern on the first source/drain pattern,
wherein a Ge content of the first source/drain pattern is less than a Ge content of the second source/drain pattern, and
a Ge content of the subgate sacrificial patterns is greater than a Ge content of the first source/drain pattern and lower than a Ge content of the second source/drain pattern.

12. The manufacturing method of claim 11, wherein
a difference between the Ge content of the first source/drain pattern and the Ge content of the second source/drain pattern is 20% or more, and
a difference between the Ge content of the subgate sacrificial patterns and the Ge content of the first source/drain pattern is 5% or more.

13. The manufacturing method of claim 2, wherein
the subgate dummy patterns include a silicon oxide.

14. A manufacturing method of a semiconductor device, the method comprising:
alternately stacking a plurality of subgate sacrificial patterns and a plurality of semiconductor patterns on a substrate;

forming a plurality of main gate sacrificial patterns spaced apart from each other on a stacked structure of the subgate sacrificial patterns and the semiconductor patterns;

forming a first insulating layer between the main gate sacrificial patterns;

removing the main gate sacrificial patterns;

removing some regions of the subgate sacrificial patterns and leaving some other regions;

forming a main gate dummy pattern in a space from which the main gate sacrificial patterns are removed, and forming a plurality of subgate dummy patterns in a space from which some regions of the subgate sacrificial patterns are removed;

forming a recess by removing the first insulating layer and removing a portion of the plurality of semiconductor patterns and the plurality of subgate sacrificial patterns positioned under a space where the first insulating layer is removed;

forming a source/drain pattern within the recess;

forming a second insulating layer on the source/drain pattern;

removing the main gate dummy pattern and the subgate dummy patterns; and forming a gate electrode in a space where the main gate dummy pattern and the subgate dummy patterns are removed.

15. The manufacturing method of claim 14, wherein
the subgate sacrificial patterns are formed of SiGe,
the semiconductor patterns are formed of Si,
the source/drain pattern is formed of SiGe, and
the subgate dummy patterns are formed of a different material from that of the source/drain pattern.

16. A semiconductor device comprising:
a substrate;
a plurality of channel patterns spaced apart from each other and stacked on the substrate;
a gate electrode surrounding the channel patterns;
a gate insulating layer between the channel patterns and the gate electrode;
source/drain patterns at opposite sides of the channel patterns; and
a plurality of subgate sacrificial patterns between the gate electrode and the source/drain patterns.

17. The semiconductor device of claim 16, wherein
the subgate sacrificial patterns are SiGe,
the channel patterns are Si, and
the source/drain patterns are SiGe.

18. The semiconductor device of claim 17, wherein
the source/drain patterns include a first source/drain pattern and a second source/drain pattern,
the first source/drain pattern is between the subgate sacrificial patterns and the second source/drain pattern,
a Ge content of the first source/drain pattern is less than a Ge content of the second source/drain pattern, and
a Ge content of the subgate sacrificial patterns is greater than a Ge content of the first source/drain pattern and lower than a Ge content of the second source/drain pattern.

19. The semiconductor device of claim 16, wherein
the subgate sacrificial patterns include a first side surface in contact with the gate insulating layer and a second side surface in contact with the source/drain patterns, and
the first side surface and the second side surface independently have a flat shape or a concave shape in a cross-sectional view.

20. The semiconductor device of claim 19, wherein the first and second side surfaces of the subgate sacrificial patterns are independently aligned in a direction parallel to or oblique to a thickness direction of the substrate.

* * * * *